US008471461B2

(12) United States Patent
Ueno et al.

(10) Patent No.: US 8,471,461 B2
(45) Date of Patent: Jun. 25, 2013

(54) ORGANIC ELECTROLUMINESCENT DEVICE AND METHOD FOR PRODUCING THE SAME

(75) Inventors: Shigehiro Ueno, Tokyo (JP); Masato Okada, Tokyo (JP)

(73) Assignee: Dai Nippon Printing Co., Ltd., Tokyo (JP)

( * ) Notice: Subject to any disclaimer, the term of this patent is extended or adjusted under 35 U.S.C. 154(b) by 377 days.

(21) Appl. No.: 12/450,224

(22) PCT Filed: Mar. 28, 2008

(86) PCT No.: PCT/JP2008/056077
§ 371 (c)(1),
(2), (4) Date: Sep. 17, 2009

(87) PCT Pub. No.: WO2008/120714
PCT Pub. Date: Oct. 9, 2008

(65) Prior Publication Data
US 2010/0084672 A1 Apr. 8, 2010

(30) Foreign Application Priority Data
Mar. 29, 2007 (JP) ................. 2007-087518

(51) Int. Cl.
*H01L 51/00* (2006.01)
(52) U.S. Cl.
USPC ........................................ 313/504; 313/506
(58) Field of Classification Search
USPC ................... 313/498–512; 428/690
See application file for complete search history.

(56) References Cited

U.S. PATENT DOCUMENTS

| 6,949,878 | B2 | 9/2005 | Suzuri et al. |
| 2001/0045565 | A1* | 11/2001 | Yamazaki ........................ 257/89 |
| 2006/0099447 | A1 | 5/2006 | Lee et al. |
| 2006/0222888 | A1 | 10/2006 | Lee et al. |
| 2009/0236974 | A1* | 9/2009 | Tamaru et al. ................ 313/504 |

FOREIGN PATENT DOCUMENTS

| JP | 09-134789 A | 5/1997 |
| JP | 2002-260858 A | 9/2002 |
| JP | 2003-68461 A | 3/2003 |
| JP | 2003-68466 A | 3/2003 |
| JP | 2003-151769 A | 5/2003 |
| JP | 2004-355975 A | 12/2004 |

(Continued)

OTHER PUBLICATIONS

International Search Report mailed on Apr. 22, 2008 for the corresponding International patent application No. PCT/JP2008/056077 (English translation enclosed).

*Primary Examiner* — Anne Hines
(74) *Attorney, Agent, or Firm* — Posz Law Group, PLC

(57) ABSTRACT

An organic EL device includes an organic luminescent layer between an anode and a cathode. The organic luminescent layer comprises at least two host materials and a dopant which is a luminescent compound. The at least two host materials are identical to or substantially identical to each other in the energy value of LUMO, but on the other hand, are different from each other in the energy value of HOMO. Alternatively, the at least two host materials are identical to or substantially identical to each other in the energy value of HOMO, but on the other hand, are different from each other in the energy value of LUMO. According to the above constitution, the balance of mobility between the electrons and holes can be regulated to solve the above problem of the prior art.

14 Claims, 8 Drawing Sheets

FOREIGN PATENT DOCUMENTS

| | | |
|---|---|---|
| JP | 2006-135295 A | 5/2006 |
| JP | 2006-210747 A | 8/2006 |
| JP | 2006-269447 A | 10/2006 |
| JP | 2006-287218 A | 10/2006 |
| JP | 2007-150191 A | 6/2007 |
| JP | 2007-251097 A | 9/2007 |
| WO | WO 2006112265 A1 * | 10/2006 |

* cited by examiner

1

ORGANIC ELECTROLUMINESCENT DEVICE AND METHOD FOR PRODUCING THE SAME

TECHNICAL FIELD

This invention relates to an organic electroluminescent device and a method for producing the same, and in particular, to an organic electroluminescent device, which can enhance the current efficiency for luminescence by optimizing a carrier balance between the number of electrons and the number of holes which are recombined in an organic luminescent layer, and a method for producing the same.

BACKGROUND

An electroluminescent device (hereinafter may be referred to as an organic EL device) is a surface light emitting device that has a laminated structure, in which an organic luminescent layer is provided between an anode and a cathode, and is a self-luminescent device that uses the luminescence when holes injected from the anode and electrons injected from the cathode are recombined inside the luminescent layer.

Researches and developments for such organic EL devices have been actively conducted for solving various technical problems. One of them is a research and development to increase the efficiency of recombination of the electrons and holes, that is, to increase the current efficiency for luminescence by optimizing the balance (carrier balance) of the number of electrons and the number of holes that are recombined in the organic luminescent layer. As a conventional technique for optimizing the carrier balance of the number of electrons and the number of holes, insertion of a charge injection layer, a charger transport layer, and a charger inhibition layer (also known as a charger block layer) is known.

A method for inserting the charge injection layer inserts, as a hole injection layer or an electron injection layer, a material layer having appropriate HOMO (Highest Occupied Molecular Orbital) or LUMO (Lowest Unoccupied Molecular Orbital), such that a charge of electrons or holes, whichever less, is injected smoothly from an electrode. The method increases efficiency of recombination of the electrons and holes by optimizing the balance of the number of carriers injected in the organic luminescent layer. Moreover, a method for inserting the charge transport layer inserts a layer of a material having hole transportability or electron transportability as the hole transport layer or the electron transport layer, respectively, between the above-discussed charge injection layer and the organic luminescent layer. The method compensates the difference between the hole mobility and the electron mobility of the organic luminescent layer by adjusting the thickness of the material layer and controlling the time for the carrier to reach the organic luminescent layer, and increases the efficiency of recombination of the charges in the organic luminescent layer. Furthermore, to increase the efficiency of recombination, the method for inserting the charge block layer inserts, as a hole block layer (hole blocking layer) or an electron block layer (electron inhibition layer), a material layer having appropriate HOMO or LUMO for suppressing a charge of the electrons or the holes having a higher number than the other, or a charge of the electrons or the holes having a higher mobility than the other, from passing though the organic luminescent layer.

In addition, for the organic luminescent layer structured by host materials and a dopant, an organic luminescent layer, in which the dopant is structured by a luminescent compound and a non-luminescent compound, and in which a band gap for the non-luminescent compound is larger than a band gap of the luminescent compound so as to increase the efficiency of recombination, has been proposed (e.g., see Patent Document 1). Moreover, similarly, an organic EL device that is structured such that, of a first dopant that has a shorter wavelength than a fluorescence peak wavelength of the host material and a second dopant that has a longer wavelength than the fluorescence peak wavelength of the host material, the second dopant emits the light, has been proposed (e.g., see Patent Document 2). Further, as a method to control the mobility of the carrier, addition of a current acceleration material in order to lower the voltage has been proposed (e.g., see Patent Document 3).

As discussed above; a few methods to increase the efficiency of recombination have been proposed. However, when adapting the organic EL device to a full-color display consisting of R (red), G (green) and B (blue), it is generally necessary to insert a hole blocking layer, a charge transport layer and the like, as well as to change an device structure of the material structuring the hole blocking layer, the charge transport layer and the like, such as a type of the materials or the optimal film thickness, with respect to each of colors for RGB.

As one of techniques to provide colors to the organic EL device, there is a method to color the organic luminescent layer with, for example, R (red), G (green) and B (blue). This method forms a luminescent layer by coloring luminescent materials with respective colors for emission in such colors, in order to achieve the luminescence with the respective luminescent colors. Therefore, it is possible to color the luminescent material highly precisely with R (red), G (green) and B (blue) without a color filter or CCM (color changing material) as a required structure the organic luminescent layer. Accordingly, it is a technique for coloring the organic EL device, which allows the organic EL device to be thinner, reduce costs, and to achieve excellent light usage efficiency. A vapor deposition method and a coating method are widely used as a method for forming the luminescent layer by the coloring method. As the vapor deposition method, there is a coloring vapor deposition method using a high definition mask. As the coating method, there are an inkjet method, a gravure method, a spray method, a photolithographic method and the like.

By the vapor deposition method, although a luminescent layer that has excellent luminescent driving life and luminescence efficiency, can be formed because lamination and high purification of the materials structuring the organic EL device can be relatively easy, there is a problem that this formation method is highly costly. The reason is that an expensive vacuum vapor deposition device that has an alignment mechanism to vapor-deposit the luminescent material of the respective color at predetermined regions, a highly precise and expensive mask for vapor-depositing the luminescent materials of the respective color at predetermined regions, are needed and the like. These cause an increase in equipment investment and a decrease in yielding. On the other hand, for the formation of the luminescent layer by the coating method, the equipment investment is relatively inexpensive compared with the vacuum vapor deposition device used in the vapor deposition method, and the area of a panel can be increased. Therefore, as a production method, the coating method is advantageous over the vapor deposition method.

[Patent Document 1] Japanese Laid-Open Patent Application No. 2003-68466
[Patent Document 2] Japanese Laid-Open Patent Application No. H9-134789
[Patent Document 3] Japanese Laid-Open Patent Application No. 2003-68461

DESCRIPTION OF THE INVENTION

Problem to be Solved by the Invention

However, when forming the hole blocking layer, the electron transport layer and the like after coloring the organic luminescent layer by the respective colors using the coating method, which has excellent merits in costs, it is necessary to change the device structure of the materials structuring the hole blocking layer, the electron transport layer and the like, such as the types and optimum film thickness, for the respectively color of RGB. Therefore, the charge transport layer for the respective colors needs to be formed by the vapor deposition or the like that uses a highly precise mask, causing a problem that merits in processes that are unique in the coating method cannot be used due to a increase in processes and a decrease in yielding.

Moreover, if the processes are to be reduced by using a single layer for regions of two or more colors applied on an electrode side with respect to the organic luminescent layer, with the organic luminescent layer of the respective colors with the lowest device characteristics as a base, a layer structure that such organic luminescent layer requires needs to be formed. Thus, a problem that the characteristics of the organic luminescent layer of other colors is sacrificed, occurs.

Further, if the organic luminescent layer is formed by applying a low molecular material, the organic luminescent layer has condensed states, such as molecular arrangements and density, which are different from those for the organic luminescent layer formed by the vapor deposition method, and concomitantly has a different mobility of the holes and electrons. Therefore, structures of the hole blocking layer, the charge transport layer and the like often need to be changed from those for the organic luminescent layer formed by the vapor deposition method.

This invention solves the above-discussed problems and has an object to provide an organic electroluminescent device, which enhances the current efficiency for luminescence by optimizing a carrier balance between the number of electrons and the number of holes which are recombined in an organic luminescent layer, and a method for producing the organic electroluminescent device. In addition, it is an object of this invention to provide an organic EL device that can share the layer structure on the cathode side from the organic luminescent layer and a method for producing the organic EL device.

Means for Solving the Problem

The inventors discovered during a process of researches to find solutions to the above problems that a balance of mobility of the electrons and holes can be adjusted by adding molecules that act as a carrier trap or an energy barrier into the organic luminescent layer, and completed this invention with additional studies.

That is, an organic electroluminescent device according to the first aspect of this invention is an organic electroluminescent device having an device structure in which an organic luminescent layer is positioned between an anode and a cathode, wherein the organic luminescent layer includes at least two types of host materials, for which energy values of LUMO (Lowest Unoccupied Molecular Orbital) are identical or substantially identical to each other, and for which energy values of HOMO (Highest Occupied Molecular Orbital) are different, and a dopant, which is a luminescent compound.

In addition, an electroluminescent device according to the second aspect of this invention is an organic electroluminescent device having an device structure in which an organic luminescent layer is positioned between an anode and a cathode, wherein the organic luminescent layer includes at least two types of host materials, for which energy values of HOMO (Highest Occupied Molecular Orbital) are identical or substantially identical to each other, and for which energy values of LUMO (Lowest Unoccupied Molecular Orbital) are different, and a dopant, which is a luminescent compound.

A difference between the invention according to the first aspect and the invention according to the second aspect is that the former includes at least two host materials for which the LUMO energy values are identical or substantially identical to each other, and the HOMO energy values are different, while the latter includes at least two host materials for which the HOMO energy values are identical or substantially identical to each other, and the LUMO energy values are different. However, they are common in that the current efficiency is enhanced by optimizing a carrier balance of the number of electrons and the numbers of holes that recombine in the organic luminescent layer. The inventions according to the first and second aspects include at least two or more host materials for which the energy values of one of HOMO and LUMO are identical and the energy values of the other are different. Therefore, these host materials act as molecules that become a carrier trap or an energy barrier in the organic luminescent layer, to adjust a balance of mobility of the electrons and the holes. As a result, (1) even when the hole blocking layer, the electron transport layers and the like are formed after forming the organic luminescent layer by coloring, it is not necessary to change the types or film thickness of the structuring materials for the colors of RGB. In addition, it is not necessary to use a film forming means that uses a highly precise mask, and thus an organic EL device with high productivity can be produced. Moreover, (2) processes can be reduced by using single layer for the hole blocking layer, the electron transport layer and the like for two or more color regions provided on the electrode side with respect to the organic luminescent layer, and thus device characteristics of the organic luminescent layer of a part of the colors are not sacrificed. Further, (3) even when the organic luminescent layer is formed by applying low molecular material, the structure of the hole blocking layer and the electron transport layer need not be changed compared to those of the organic luminescent layer formed by the vapor deposition.

In the organic electroluminescent device of this invention, the host materials and the dopant are preferably low molecular compounds. The reason is that, in case of middle molecular compounds or high molecular compounds, some groups co-exists within the same molecules due to copolymerization or the like. Therefore, distribution of energy levels, such as HOMO or LUMO, is presumably larger compared to the case of low molecular compounds because of a difference in molecular conformation. Accordingly, effects of carrier traps and energy barriers by the mixture of host materials are furtive. On the other hand, in the case of the low molecular compound, distribution of the energy levels is small because the structure is simple compared with the case of middle molecular compounds and high molecular compounds. Moreover, effects can be easily seen when materials having different energy levels are added. Therefore, the low molecular compounds are preferable to be used in this invention. Further, compared with the middle molecular compounds and the high molecular compounds, the low molecular compounds are preferable for its longer life and higher efficiency.

In the organic electroluminescent device of this invention, one of the at least two host materials with a lower contained amount is included at a contained amount that is two or more times of a contained amount of the dopant. Although the luminescent dopant itself may actually become a carrier trap site, there is a problem that luminescent efficiency decreases due to concentration quenching if a concentration of the luminescent dopant increases. On the other hand, because the host material with a lower contained amount is included at a contained amount that is two or more times of the contained amount of the dopant according to this invention, effects of the carrier trap by the luminescent dopant decreases, and thereby the concentration of the carrier trap can be mainly controlled while the concentration of the luminescent dopant is maintained at the optimum level.

The organic electroluminescent device of this invention is structured, such that a difference of the energy values of the at least two host materials, for which the HOMO or LUMO energy values are identical or substantially identical to each other, is smaller than ±0.15 eV, and that a difference of the energy values of the at least two host materials, for which the LUMO or HOMO energy values are different from each other, is equal to or greater than 0.15 eV and equal to or less than 0.60 eV. According to this invention, the difference of the energy values of the at least two host materials, for which the HOMO or LUMO energy values are identical or substantially identical to each other, is smaller than ±0.15 eV, and a difference of the energy values of the at least two host materials, for which the LUMO or HOMO energy values are different from each other, is equal to or greater than 0.15 eV and equal to or less than 0.60 eV. Therefore, the effects of this invention, that is, the host materials function as molecules that become the carrier trap or the energy barrier in the organic luminescent layer, and a balance of mobility of the electrons and the holes can be adjusted, can be remarkably achieved.

The organic electroluminescent device of this invention is structured, such that a driving voltage of the device that includes the at least two host materials is made higher compared to the device that includes only one of the at least two host materials, which is contained at the larger amount in the at least two host materials than the other one of the at least two host materials. If the two types of host materials are contained at the equal amount, the driving voltage of the device is higher than an device that includes only one of the host materials that is driven at a lower driving voltage.

In the organic electroluminescent device of this invention, a hole blocking layer and an electron transport layer are preferably provided in order between the organic luminescent layer and the cathode. According to this invention, in case where the hole blocking layer and the electron transport layer are provided in order between the organic luminescent layer and the cathode, it is not necessary to change types and film thicknesses of the materials structuring the hole blocking layer and the electron transport layer for each color of RGB. In addition, it is not necessary to use a film producing means that uses a precise mask, thereby producing an organic EL device with high productivity.

In the organic electroluminescent device of this invention, the hole blocking layer and the electron transport layer are preferably formed such that the hole blocking layer and the electron transport layer cover two or more regions of organic luminescent layer regions that illuminate lights in R (red), G (green) and B (blue). According to this invention, because the hole blocking layer and the electron transport layer are formed such that the hole blocking layer and the electron transport layer cover two or more regions of organic luminescent layer regions that illuminate lights in R (red), G (green) and B (blue), there are more merits in processes compared to the case in which different layers are formed for each color.

A method of producing an organic electroluminescent device of this invention for solving the above problems is a method of producing an organic electroluminescent device having an device structure in which an organic luminescent layer is provided between an anode and a cathode. A forming process of the organic luminescent layer is performed by applying an organic luminescent layer forming material that includes at least two types of host materials, for which energy values of LUMO (Lowest Unoccupied Molecular Orbital) are identical or substantially identical to each other, and for which energy values of HOMO (Highest Occupied Molecular Orbital) are different, or at least two types of host materials, for which energy values of HOMO (Highest Occupied Molecular Orbital) are identical or substantially identical to each other, and for which energy values of LUMO (Lowest Unoccupied Molecular Orbital) are different, and a dopant, which is a luminescent compound.

According to this invention, because the organic luminescent layer is performed by applying an organic luminescent layer forming material that includes at least two types of host materials, for which energy values of LUMO (Lowest Unoccupied Molecular Orbital) are identical or substantially identical to each other, and for which energy values of HOMO (Highest Occupied Molecular Orbital) are different, or at least two types of host materials, for which energy values of. HOMO (Highest Occupied Molecular Orbital) are identical or substantially identical to each other, and for which energy values of LUMO (Lowest Unoccupied Molecular Orbital) are different, and a dopant, which is a luminescent compound, the host materials that structure the organic luminescent layers function as molecules that become a carrier trap or an energy barrier in the organic luminescent layer, and enhances current efficiency for luminescence by optimizing a carrier balance of the number of the electrons and the number of the holes that recombine in the organic luminescent layer. As a result, the organic EL device obtained by this production method, the same effects as those in the above (1)-(3) are achieved.

In the method for producing the organic electroluminescent device of this invention, a hole blocking layer and an electron transport layer are preferably applied and formed in order between the organic luminescent layer and the cathode.

In the method for producing the organic electroluminescent device of this invention, the hole blocking layer and the electron transport layer are preferably applied and formed such that the hole blocking layer and the electron transport layer cover two regions of organic luminescent layer regions that illuminate lights in R (red), G (green) and B (blue).

EFFECT OF THE INVENTION

According to the organic electroluminescent device and the method for producing the organic electroluminescent device of this invention, a host material structuring the organic luminescent layer acts as a molecule that functions as a carrier trap or an energy barrier in the organic luminescent layer to adjust the balance of mobility of the electrons and holes. Therefore, (1) even if a hole blocking layer, a charge transport layer and the like are formed after forming the organic luminescent layer by coloring, types and film thicknesses of the structuring materials need not be changed for the respective color of RGB, and a film forming means that uses a highly precise mask need not be used, thereby forming an organic EL device with excellent productivity. Moreover, (2) processes can be reduced by using a single layers of the hole blocking layer, the charge transport layer and the like for two or more color regions of the organic luminescent layer on an electrode side without sacrificing the device characteristics of the organic luminescent layer of a part of colors. Furthermore, (3) even if the organic luminescent layer is formed by applying the low molecular material, the structure of the hole blocking layer and the charge transport layer need not be changed compared with that for the organic luminescent layer formed by the vapor deposition method.

The organic electroluminescent device of this invention may be preferably utilized as a low cost area color display, multi-color display, full color display or the like.

BRIEF DESCRIPTION OF THE DRAWINGS

FIG. 3(A) shows a case in which compounds having the energy values of HOMO different from each other are used together. FIG. 3(B) shows a case in which compounds having the energy values of LUMO different from each other are used together.

DETAILED DESCRIPTION

Below explains embodiments of the organic electroluminescent device (organic EL device) and the production method thereof according to this invention. This invention is not limited to the below embodiments

[Organic EL Device]

Figure 1:
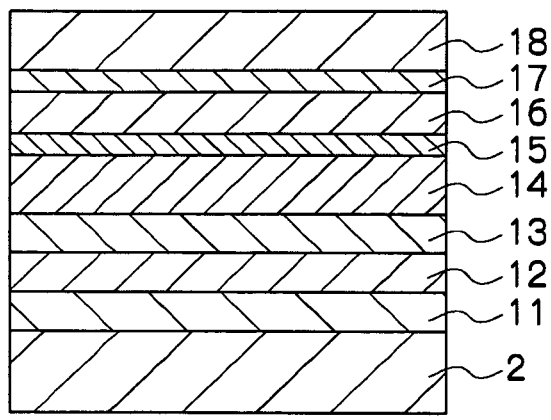
FIG. 1 is a schematic cross-sectional view showing a basic device structure of the organic EL device of this invention.

FIG. 1 is a schematic cross sectional view showing a basic device structure of an organic EL device according to this invention. The organic EL device 1 of this invention has an device structure in which an organic luminescent layer 14 is provided between an anode 11 and a cathode 18. As shown in more detail in FIG. 1, an embodiment is shown in which the anode 11, a hole injection layer 12, a hole transport layer 13, the organic luminescent layer 14, a hole blocking layer 15, an electron transport layer 16, an electron injection layer 17 and the cathode 18 are formed on a substrate 2 in order. In the organic EL device according to the first point of this invention, the organic luminescent layer 14 includes at least two types of host materials that have identical or substantially identical LUMO energy values and have different HOMO energy values, and a dopant. In addition, in the organic EL device according to the second point of this invention, the organic luminescent layer 14 includes at least two types of host materials that have identical or substantially identical HOMO energy values and have different LUMO energy values, and a dopant.

The structuring device equipped by the organic EL device of this invention is discussed in order in detail below.

(Substrate)

The substrate 2 is explained first. Structures, such as a type, shape, size, thickness or the like, for the substrate 2 are not limited and may be appropriately determined from the use of the organic EL device, materials for each layer laminated onto the substrate, and the like. For example, various materials including a metal, such as Al, glass, quarts, resin or the like may be used. In case of an organic EL device having a bottom emission structure that ejects the light emitted from the organic luminescent layer 14, from the substrate 2 side, it is preferred that the substrate 2 is formed by a transparent or semi-transparent material. In case of an organic EL device having a top emission structure that ejects the light emitted from the organic luminescent layer 14 from the opposite side of the substrate 2, it is not necessary to use a transparent or semi-transparent material, but the substrate 2 may be formed by an opaque material.

In particular, materials used in general may be used as the substrate for the organic EL device, and a flexible material or a hard material may be selected depending on the use. Examples of the specific materials that can be used include glass, quartz, polyethylene, polypropylene, polyethylene terephthalate, polyethylene naphthalate, polymethacrylate, polymethyl acrylate, polymethyl methacrylate, polyester, and polycarbonate. In addition, the shape of the substrate 2 may be a leaf shape or a continuous shape. Specifically, examples of the shape may include a card shape, a film shape, a disk shape and a chip shape.

(Anode)

The anode 11 is provided on the substrate 2 in FIG. 1. A thin film of a forming material, such as metal, conductive oxide, and conductive high molecules, may be used. More specifically, examples include transparent conductive films, such as ITO (indium tin oxide), indium oxide, IZO (indium zinc oxide), $SnO_2$ and ZnO, metals with large work functions, such as gold and chrome, and conductive high molecules, such as polyaniline, polyacetylene, polyalkylthiophene derivatives and polysilane derivatives. If the anode 11 is located on a light exit side, the anode 11 is preferably transparent or semi-transparent. Therefore, transparent conductive materials, such as ITO (indium tin oxide), indium oxide, IZO (indium zinc oxide), $SnO_2$ and ZnO are preferably used.

The anode 11 may be formed by a vacuum process, such as vacuum deposition, spattering and CVD, or by coating. It is preferable that a film thickness of the anode 11 is approximately 100 nm-1,000 nm, depending on the materials to be used and the like.

(Hole Injection Layer)

The hole injection layer 12 is not a required layer in this invention. However, the hole injection layer 12 is normally appropriately provided on the anode 11 and operates such that the holes can be easily injected from the anode 11. A material that allows the above-discussed function may be preferably used as the material for forming the hole injection layer 12. For example, pigment system materials, metallic complex system materials and high molecular materials, which are discussed as examples for the later-discussed organic luminescent layer 14, phenylamine systems, starburst-type amine systems, phthalocyanine systems, oxidative product, such as vanadium oxide, molybdenum oxide, ruthenium oxide and aluminum oxide, and derivatives, such as amorphous carbon, polyaniline and polythiophene, may be generally used as the material for the hole injection layer. For the material for forming the hole injection layer, poly(3,4)ethylene dioxithiophene/polystyrene sulfonatate (abbreviated as PEDOT/PSS, by Bayer Corporation, Product Name: Baytron P CH8000, sold as a solution), which is sold in public, and the like may also be used.

The hole injection layer 12 may be formed by a vacuum process, such as vacuum deposition, spattering, CVD or the like, or by coating with merits in process. It is preferable that a thickness of the hole injection layer 12 is in a range of approximately 0.5 nm-1,000 nm, depending on the materials to be used and the like.

(Hole Transport Layer)

The hole transport layer 13 is not a required layer in this invention. However, the hole transport layer 13 is generally appropriately provided on the anode 11 or the hole injection layer 12 and functions such that the holes supplied from the anode 11 is transported to the organic luminescent layer. In addition, depending of the material used, the hole transport layer 13 may function as an electron inhibition layer (also known as an electron block layer) that blocks electrons supplied from the cathode 18 to the organic luminescent layer 14. As the material for forming the hole transport layer 13, arylamines derivatives, anthracene derivatives, carbazole derivatives, thiophene derivatives, florene derivatives, distyrylbenzene derivatives and Spiro compound, for example, may be used. Specific examples of the arylamines derivatives may include bis(N-(1-naphthyl-N-phenyl)-benzidine (α-NPD), N,N'-bis-(3-methylphenyl)-N,N'-bis-(phenyl)-benzidine (TPD), copoly[3,3'-hydroxy-tetraphenyl benzidine/diethylene glycol]carbonate (PC-TPD-DEG) and the like. Specific examples of the carbazole type may include polyvinyl carbazole (PVK) and the like. Specific examples of the thiophene derivatives include poly[(9,9-dioctyl fluorenyl-2,7-diyl)-co-(bithiophene)] and the like. The specific examples of the florene derivatives include poly[(9,9-dioctyl fluorenyl-2,7-diyl)-co-(4,4'-(N-(4-sec-butylphenyl))diphenylamine)] (TFB) and the like. Specific examples of the spiro compound include poly[(9,9-dioctyl fluorenyl-2,7-diyl)-alt-co-(9,9'-spiro-biflorene-2,7-diyl)] and the like. These materials may be used alone, or two or more kinds may be used together.

The hole transport layer 13 may include an additive, such as a binder resin, a hardening resin, and a coating-improving agent, as needed. As the binder resin, polycarbonate, polystyrene, polyarylate, polyester and the like may be used. In addition, in the hole transport layer 13, it is preferable that heat and/or light-hardening materials is additionally contained. Alternatively, it is preferable that the hole-transportable material included in the hole transport layer 13 includes a heat and/or light hardening functional group. Here, the hole-transportable material included in the hole transport layer 13 includes the host materials for the organic luminescent layer or luminescent material contained in the hole transport layer 13, and the hole-transportable material contained substantially only in the hole transport layer.

By having characteristics in hardening by heat and/or light, it is possible to harden the hole transport layer 13. Therefore, even if the adjacent organic luminescent layer 14 is formed by coating, elusion of the components structuring the hole transport layer 13 is reduced when applying a coating solution for forming the organic luminescent layer. As the heat and/or light-hardening functional group introduced in the material for transporting the holes included in the hole transport layer 13, acrylic functional groups, such as acrylyl group and methacryloyl group, vinyl group, vinylene group, epoxide group, isocyanate group, cinnamate group, cinnamoyl group, coumarin group and carbazole group may be used. As the hole-transportable materials in which the above-discussed hardening functional group is introduced inside molecules, specific examples may include poly[(9,9-dioctyl fluorenyl-2,7-diyl)- alto-co-(9,9'-di-{5-pentenyl}-fluorenyl-2,7-diyl)] and poly [(9,9-di-{5-pentenyl}-fluorenyl-2,7-diyl)-co-(4,4'-(N-(4-sec-butylphenyl))diphenylamine)] (heat hardening TFB), which are fluorene derivative and have the vinyl group in their structure.

Further, as the heat and/or light hardening material to be added, epoxide resin, phenol resin, melamine resin, polyester resin, polyurethane resin, silicone resin, silane coupling agent and compounds that include in the molecules two or more ethylene double bonds, such as vinyl group, vinylene group, acrylyl group, and methacryloyl group, for example, may be used.

The hole transport layer 13 may be formed by a coating method that uses a coating solution for forming the hole transport layer that includes the above-discussed material. It is preferable that a thickness of the hole transport layer 13 is in a range of approximately 1 nm-50 nm, for example, depending on the materials to be used and the like. In addition, the material for the hole transport layer may be mixed into the above-discussed hole injection layer 12 or the later-discussed organic luminescent layer 14.

(Organic Luminescent Layer)

The organic luminescent layer 14 is a required layer in this invention and is provided on the hole transport layer 13 in FIG. 1. However, the organic luminescent layer 14 may be provided directly on the anode 11 or may be provided on the hole injection layer 12. The organic luminescent layer 14 is a layer structured such that the current efficiency for luminescence is increased by optimizing the carrier balance of the number of electrons and the number of holes to be recombined and includes a host material composed of at least two types of compounds, of which one of the HOMO and LUMO is identical and the other is different, and a dopant, which is a luminescent compound.

The dopant is a luminescent compound that bears the main luminescent characteristics for the organic luminescent layer 14. A low molecular compound with high luminescent efficiency may be preferably used. As such a dopant, perylene derivatives, coumarin derivatives, rubrene derivatives, quinacridone derivatives, squarium derivatives, porphyrin derivatives, styryl-type pigment, tetracene derivatives, pyrazoline derivatives, decacyclene, phenoxazone, quinoxaline derivative, carbazole derivative, fluorene derivative, and the like may be used. Moreover, compounds to which a Spiro group is introduced may be used.

More specifically, 1-tert-butyl-perylene (abbreviated as TBP), coumalin 6, nile red, 1,4-bis(2,2-diphenylvinyl)benzol (abbreviated as DPVBi), 1,1,4,4-tetraphenyl-1,3-butadiene (abbreviated as TPB), 4,4'-bis[4-(di-p-tolylamino)styryl]biphenyl (abbreviated as BDAVBi) and the like may be used. These materials may be used alone, or two or more kinds may be used together. In addition, as a phosphorescence dopant, organic metal complexes that have a heavy-metal ion, such as platinum and iridium, in its center and indicate phosphorescence can be used. More specifically, well-known $Ir(ppy)_3$, $(ppy)_2Ir(acac)$, $Ir(BQ)_3$, $(BQ)_2Ir(acac)$, $Ir(THP)_3$, $(THP)_2Ir(acac)$, $Ir(BO)_3$, $(BO)_2Ir(acac)$, $Ir(BT)_3$, $(BT)_2Ir(acac)$, $Ir(BTP)_3$, $(BTP)_2Ir(acac)$, FIr6, PtOEP, and the like may be used. These materials may be used alone, or two or more kinds may be used together.

If the later-discussed host material is a middle molecular or high molecular material, the above-discussed dopant may be included in the molecular structure of the middle molecular and high molecular material as a luminescent material. In this application, the "low molecule" is defined as a molecule having a molecular weight in a range of 70-2,000, the "medium molecule" is defined as a molecule having a weight average molecular weight in a range of 2,000-10,000, and the "high molecule" is defined as a molecule having a weight average molecular weight in a range of 10,000-1,000,000. The molecular weight for the low molecular material is a single value, which is different from distributed values for the middle or high molecular materials, and may be determined by the molecular structure. The structure of the low molecular material is generally determined by the mass spectrometry NMR method, the IR method, the mass spectrometry method and the like. On the other hand, the weight average molecular weight for the middle and high molecular materials may be determined that is determined by measuring a gel osmotic chromatography (GPC) and performing a polystyrene conversion.

The combination ratio (contained amount) of the dopant varies depending on the luminescent color or the type of the materials used. It is preferable that the dopant is added at approximately 1-20% by weight (% by weight and % by mass have the same meaning. Same in below) in the weight ratio, and more preferably in a range of 1-10% by weight, with respect to the combined weight of the host materials and the dopant.

The host materials are not particularly limited to the low molecular material or the middle or high molecular material, as long as it is a material generally used for the organic luminescent layer. However, the host material is structured by at least two types of compounds for which at least one of the HOMO and LUMO is identical and the other is different. In detail, at least two types of host materials for which (a) the energy values of LUMO are identical or substantially identical to each other, and the energy values of HOMO are different, or (b) the energy values of HOMO are identical or substantially identical to each other, and the energy values of LUMO are different.

After selecting a base host material and the dopant that structure the organic luminescent layer 14, this invention combines, as a second compound, a compound that has an energy value different from the energy value of HOMO or LUMO of the base host material, such that, in consideration of the carrier balance of the holes and electrons, the mobility of a charge of either one (holes or electrons) can be suppressed. At least two types of compounds that structure the organic luminescent layer 14 act as molecules that form a carrier trap or an energy barrier in the organic luminescent layer and function to adjust the balance of the mobility of the electrons and holes. From a point of view of the process stability, it is preferable that two types of host materials are mixed. However, three or more types of host materials may be mixed.

Figure 2:
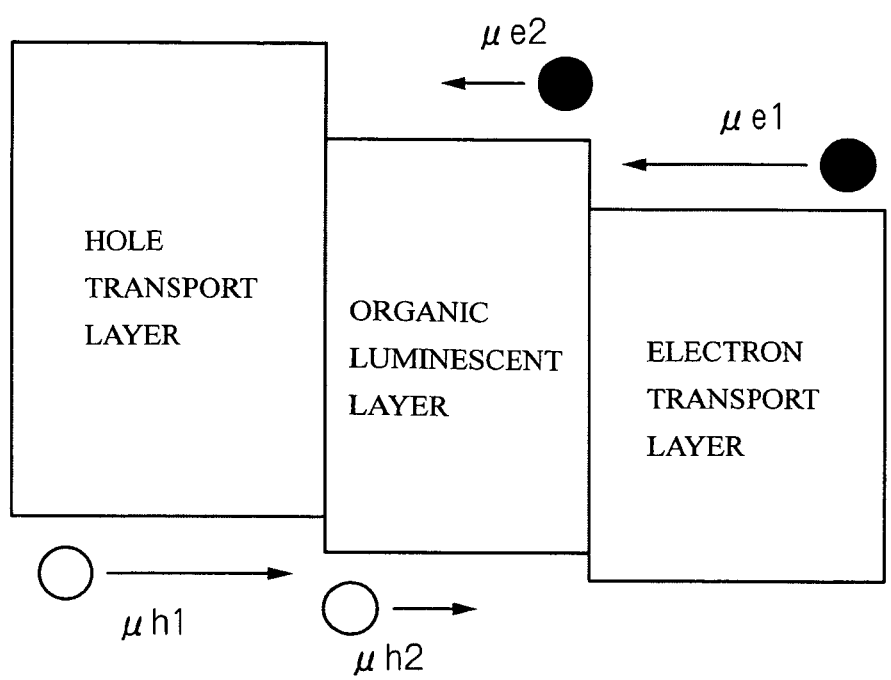
FIG. 2 is a basic schematic energy diagram for main layers structuring the organic EL device.
Figure 3:
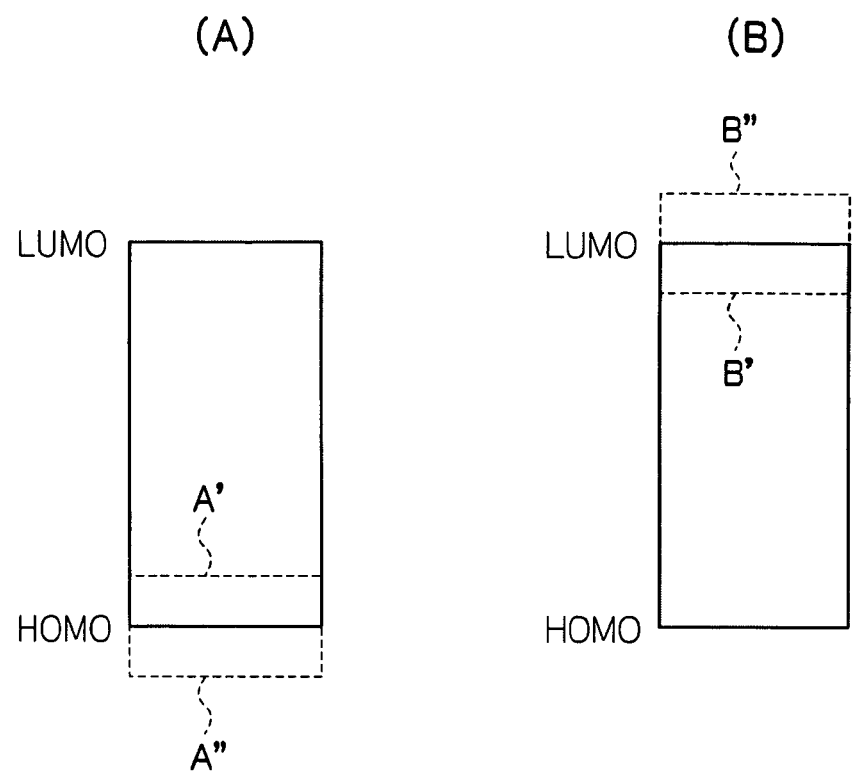
FIG. 3 is a schematic energy diagram showing HOMO and LUMO of two types of compounds structuring an organic luminescent layer.

FIG. 2 is a schematic energy diagram for main layers structuring the organic EL device. FIG. 3 is a schematic energy diagram showing an embodiment of HOMO and LUMO for two types of compounds structuring the organic luminescent layer. FIG. 3(A) shows a case in which compounds having different energy values of HOMO are used together, and FIG. 3(B) shows a case in which compounds having different energy values of LUMO are used together.

When using compounds for which the energy values of LUMO are identical or substantially identical to each other and the energy values of HOMO are low, holes are trapped at A' which is at an energy level that is higher than A (i.e., inside the energy gap) as shown by the dotted line A' in FIG. 3(A). Because the trapped holes function as an electrostatic repulsing site and act to suppress transportation of the holes, the mobility of the holes to be recombined can be suppressed. On the other hand, when using compounds for which the energy values of LUMO are identical or substantially identical to each other and the energy values of HOMO are high, the holes are trapped at A" which is at an energy level that is lower than A (i.e., outside the energy gap) as shown by the dotted line A" in FIG. 3(A). Because the trapped holes function as an energy barrier site to prevent a chance of hopping conduction, or prevent the mobility of the holes from the hole transport layer to the organic luminescent layer, and act to suppress the flow of the holes, the mobility of the holes to be recombined can be suppressed.

In contrast, when using compounds for which the energy values of HOMO are identical or substantially identical to each other and the energy values of the LUMO are high, electrons are trapped at B' which is at an energy level that is higher than B (i.e., inside the energy gap) as shown by the dotted line B' in FIG. 3(B). Because the trapped electrons function as an electrostatic repulsing site and act to suppress transportation of the electrons, the mobility of the electrons to be recombined can be suppressed. On the other hand, when using compounds for which the energy values of HOMO are identical or substantially identical to each other and the energy values of LUMO are low, the electrons are trapped at B" which is at an energy level that is lower than B (i.e., outside the energy gap) as shown by the dotted line B" in FIG. 3(B). Because the trapped electrons function as an energy barrier site to prevent a chance of hopping conduction, or prevent the mobility of the electrons from the electron transport layer to the organic luminescent layer, and act to suppress the flow of the electrons, the mobility of the electrons to be recombined can be suppressed.

If the host materials, for which the energy values of LUMO are different and the energy values of HOMO are also different, are used, there are problems, for example, that the carrier mobility of the holes and electrons cannot be controlled, and that excimer is formed due to the mutual interaction of HOMO of one of the host materials and LUMO of the other host material, causing that the energy does not move well to the luminescent dopant. The excimer can be easily formed as HOMO of one of the host materials becomes closer to LUMO of the other host materials, even if the difference between the values of the energy gap (Eg) of the host materials is significant. Therefore, by configuring the difference in the energy gap of the two or more types of host materials at equal to or less than 1.00 eV, and more preferably, equal to or less than 0.60 eV, energy can be moved well to the luminescent dopant.

In the at least two types of compounds structuring the organic luminescent layer 14, the difference between the energy values of HOMO or LUMO which values are different may be set in consideration of the mobility of holes and electrons. In general, it is preferable that the energy difference may be adjusted in a range of equal to or greater than 0.15 eV and equal to or less than 0.60 eV. Moreover, regarding the combination ratio of the at least two compounds, the amount for combination is adjusted in response to the carrier balance of the base host material and the dopant.

In this specification, the energy values of HOMO or LUMO being "substantially identical" means that the difference in the energy values of HOMO or LUMO of at least two types of compounds structuring the organic luminescent layer 14 is smaller than ±0.15 eV (less than ±0.15 eV).

Therefore, as a preferred embodiment of this invention, for at least two types of host materials for which the energy values of HOMO or LUMO are identical or substantially identical to each other, the difference in the energy values is preferably smaller than ±0.15 eV. In addition, for at least two types of host materials for which the energy values of LUMO or HOMO are different, the difference in the energy values are preferably configured equal to or greater than 0.15 eV and equal to or less than 0.60 eV. With such a structure, the host materials act as molecules to form a carrier trap or an energy barrier in the organic luminescent layer, and the mobility of the electrons and holes is adjusted, thereby achieving the remarkable effects of this invention.

As the low molecular host materials, fluorescent or phosphorescent materials may be used if the materials are structured by a combination of materials having the above-discussed relationships of the energy values of LUMO and HOMO. Specific materials include pigment materials and metal complex materials.

As the pigment materials, arylamines derivatives, anthracene derivatives, phenylanthracene derivatives, oxadiazole derivatives, oxazole derivative, oligothiophene derivative, carbazole derivatives, cyclopentadiene derivative, silole derivatives, distyrylbenzene derivatives, distyrylpyrazine derivatives, distyrylarylene derivatives, stilbene derivatives, Spiro compounds, thiophene cyclic compound, tetraphenylbutadiene derivatives, triazole derivatives, triphenylamine derivatives, trifluamine derivatives, pyrazoloquinoline derivative, hydrazone derivatives, pyrazoline dimer, pyridine cyclic compounds, fluorene derivatives, phenanthroline types, perinone derivatives, perylene derivatives, and the like may be used. Moreover, dimer, trimer or oligomer compounds, or compounds of two or more types of derivatives may be used. Specifically, as the triphenylamine derivatives, N,N'-bis-(3-methylphenyl)-N,N'-bis-(phenyl)-benzidine (abbreviated as TPD), 4,4,4-tris(3-methylphenylphenylamino)triphenylamine (abbreviated as MTDATA) and the like may be used. As the arylamines type, bis(N-(1-naphthyl-N-phenyl)-benzidine (abbreviated as α-NPD) may be used. As the oxadiazole derivatives, (2-(4-biphenylyl)-5-(4-tert-butylphenyl)-1,3,4-oxadiazole (abbreviated as PBD) may be used. As the anthracene derivatives, 9,10-di-2-naphthylanthracene (abbreviated as DNA) may be used. As the carbazole derivatives, 4,4-N,N'-dicarbazole-biphenyl (abbreviated as CBP), 1,4-bis(2,2-diphenylvinyl)benzol (abbreviated as DPVBi) and the like are used. As the phenanthroline types, bathocuproin, bathophenanthroline and the like may be used.

As the metal complex materials, for example, almiquinolinol complex, bezoquinolinolberylium complex, benzoxazole zinc complex, benzothiazole zinc complex, azomethyl zinc complex, porphyrin zinc complex, europium complex, or metal complex that has metal, such as Al, Zn and Be, or rare-earth metal, such as Tb, Eu and Dy in the center and has oxadiazole, thiadiazole, phenylpyridine, phtenylbenzimidazole, or quinoline structure, may be used. More specifically, tris(8-quinolinolato)aluminum complex (abbreviated as Alq3), bis(2-methyl-8-quinolinolato)(p-phenylphenolate) aluminum complex (abbreviated as BAlq), tri(dibenzomethyl)phenanthroline europium complex, and bis(benzoquinolinolato)beryllium complex (abbreviated as BeBq) may be used.

Further, various add-in materials may be included in the organic luminescent layer 14 within a scope that does not depart from the objects of this invention, which is to increase the current efficiency for luminescence by optimizing the carrier balance of the number of electrons and holes to be combined. For example, luminescent materials, such as oligomer material and dendrimer material, for the purpose of, for example, adjusting the illumination color and the color, may be included. Alternatively, charge transporting materials may be included. Further, for the coating solution for forming the luminescent layer, resin materials for adjusting viscosity, materials that hardens by heat or light, or materials for changing luminescent wavelength may be added. As the resin materials for adjusting the viscosity, polycarbonate, polystyrene, polyarylate, polyester and the like may be used. Furthermore, as the heat or light hardening materials, materials in which a hardening functional group is introduced in molecules of the above-discussed luminescent layer forming material, a hardening resin, or the like may be used. For example, as the hardening functional group, acrylic functional groups, such as acrylyl group and methacryloyl group, vinylene group, epoxide group, isocyanate group and the like may be used. As the hardening resin, either a heat hardening resin or a light hardening resin may be used. For example, epoxide resin, phenol resin, melamine resin, polyester resin, polyurethane resin, silicone resin, silane coupling agent and the like may be used.

A particularly preferred contained amount of the luminescent dopant for the combined weight of the host materials and the dopant is equal to or less than one half of one of at least two host materials which contained amount is less than the other host material. In other words, the contained amount of one of at least two host materials whose contained amount is less than the other host material is preferably equal to or greater than twice of the contained amount of the dopant. If the concentration of the dopant is increased, the luminescent efficiency decreases due to concentration quenching. However, by structuring the host materials and dopant such that the contained amount of one of the host materials that has a less contained amount than the other host material is set equal to or greater than twice of the contained amount of the luminescent dopant, a concentration of the carrier trap can be controlled while the concentration of the luminescent dopant is maintained at the optimum level.

The thickness of the organic luminescent layer 14 is not particularly limited but may be, for example, approximately 5 nm-200 nm, and more preferably, 20 nm-100 nm. If the organic luminescent layer 14 is too thick, it is possible that the luminescent efficiency decreases as a large applied voltage is required to obtain a certain level of optical mount. If the organic luminescent layer 14 is too thin, quality of the film decreases, causing inability of improving the luminescent characteristics.

The organic luminescent layer 14 is formed by the coating method. The coating method is a method to apply a coating solution for forming the luminescent layer that includes at least the host materials and the dopant onto the hole transport layer 13, for example, at a predetermined patter. By this method, the organic luminescent layer 14, which is the coated layer, is formed. As a coating means, various methods including ink jet method, spray coating method, and the like, may be used.

(Hole Inhibition Layer)

The hole blocking layer 15 is not a required layer in this invention but, in general, is preferably provided on the organic luminescent layer 14. The hole blocking layer 15 blocks the holes injected from the anode 11 from penetrating through the organic luminescent layer 14 and functions to increase the chance for recombination of the holes and electrons. As the materials for forming the hole blocking layer 15, for example, metal complexes, oxadiazole derivatives, triazole derivatives, phenanthroline derivatives, silyl compounds, spiro compound and the like may be used. For example, specific examples of the phenanthroline type may include bathocuproin, bathophenanthroline or the like. As specific examples of the metal complexes include bis(2-methyl-8-quinolinolato)(p-phenylphenolate)aluminum complex (BAlq) or the like. As the oxadiazole derivatives, (2-(4-biphenylyl)-5-(4-tert-butylphenyl)-1,3,4-oxadiazole (PBD) or the like may be used. These materials may be used alone, or two or more types thereof may be used together.

The hole blocking layer 15 may be formed by a vacuum process, such as vacuum deposition, spattering, CVD or the like, or a coating method that has the merits in process. The thickness of the hole blocking layer 15 may vary depending on the materials used and the like but is preferably within a range of 1 nm-100 nm, for example.

(Electron Transport Layer)

The electron transport layer 16 is not a required layer in this invention but, in generally, is preferably provided on the organic luminescent layer 14 or the hole blocking layer 15. The electron transport layer 16 functions so as to transport the electrons supplied from the cathode 18 to the organic luminescent layer 14. As the material for forming the electron transport layer 16 is not particularly limited as long as it includes materials that are capable of smoothly transporting the electrons from the electron injection layer 17 to the organic luminescent layer 14. As such a material having electron transportability, metal complex, oxadiazole derivatives, triazole derivatives, phenanthroline derivatives, silyl compounds or the like may be used. For example, as the phenanthroline type, bathocuproin, bathophenanthroline or the like may be used. As specific example of the metal complex, tris(8-quinolinolato)aluminum complex ($Alq_3$) or the like may be used. As the oxadiazole derivatives, (2-(4-biphenyl-yl)-5-(4-tert-butylphenyl)-1,3,4-oxadiazole (PBD) or the like may be used. These materials may be used alone, or two or more types thereof may be used together.

The electron transport layer 16 may be formed by the vacuum deposition method or the coating method using the coating solution for forming the electron transport layer that includes the above-discussed materials. The thickness of the electron transport layer 16 may vary depending on the material used or the like but is preferably about 5 nm-50 nm, for example. The material for the electron transport layer may be mixed in the later-discussed electron injection layer 17 or in the above-discussed organic luminescent layer 14.

(Electron Injection Layer)

The electron injection layer 17 is not a required layer in this invention but, in general, is preferably provided between the cathode 18 and the electron transport layer 16 while contacting the cathode 18. The electron injection layer 17 functions such that the electrons can be easily injected from the cathode 18. As the material for forming the electron injection layer 17, in addition to the compounds that are discussed as examples for the luminescent materials for the organic luminescent layer 14, alkali metal, such as aluminum, lithium fluoride, strontium, magnesium oxide, magnesium fluoride, strontium fluoride, calcium fluoride, barium fluoride, aluminum oxide, strontium oxide, calcium, polymethyl methacrylate polystyrene sulfone sodium, lithium, cesium, cesium fluoride or the like, alkali metal type halogenide, organic complexes of alkali metal, or the like may be used.

The electron injection layer 17 may be formed by a vacuum process, such as vacuum deposition, spattering, CVD or the like, or the coating method. The thickness of the electron injection layer 17 may vary depending on the materials used and the like but is preferably about 5 nm-30 nm, for example.

(Cathode)

The cathode 18 is a required device provided on the electron injection layer 17 in FIG. 1. As a material for forming the cathode 18, a thin film of metal, conductive oxide, conductive high molecules, and the like may be used. For example, simple metals, such as aluminum and silver, a magnesium alloy, such as MgAg, an aluminum alloy, such as AlLi, AlCa and AlMg, alkali metal types, such as Li and Ca, metals, such as an alkali metal type alloy, which has small work functions, may be used. If the cathode 18 is positioned on the light exit side, because it is preferable that the cathode 18 is transparent or semi-transparent, transparent conductive materials, such as ITO (indium tin oxide), indium oxide, IZO (indium zinc oxide), $SnO_2$, ZnO or the like, may be preferably used.

Similar to the case of the above-discussed anode 11, the cathode 18 may be formed by a vacuum process, such as vacuum deposition, spattering, CVD or the like, or the coating method. The film thickness thereof may vary depending on the materials used and the like but is preferably about 10 nm-1,000 nm, for example. In addition, as shown in FIG. 1, if the cathode 18 is formed on a layer of organic compound, such as the electron injection layer 17, a protection layer may be provided to reduce damage to the organic compound layer at the time of forming the cathode.

The organic EL device 1 shown in FIG. 1 may be structured as discussed above. However, if necessary, for the purpose of color correction, a luminescent material of an electron transport materials made of an oligomer or dendrimer material may be included in the above-discussed hole injection layer 12, hole transport layer 13, organic luminescent layer 14, hole blocking layer 15, electron transport layer 16 and/or electron injection layer 17.

Because such organic EL device 1 of this invention includes at least two or more types of host materials in which one of HOMO and LUMO are identical and the other is different, the host materials functions as a carrier trap or an energy barrier in the organic luminescent layer and adjust the balance of mobility of the electrons and holes. As a result, there are the following effects. (1) Even if the hole blocking layer or the electron transport layer or the like is formed after coating the organic luminescent layer, it is not necessary to change the types, thicknesses or the like of the structuring materials for each color of RGB, and thus, the organic EL device with high productivity can be achieved without using a film forming means that uses a high resolution mask. Moreover, (2) processes can be reduced by using a single layer to two or more color regions on the organic luminescent layer on the electrode side, without sacrificing device characteristics of the organic luminescent layer of a part of the colors. Furthermore, (3) even if the organic luminescent layer is formed by coating with low molecular materials, the structure of the hole blocking layer or the electron transport layer need not be changed from that in the organic luminescent layer formed by the vacuum deposition method.

(Detailed Embodiment of Organic EL Device)

Figure 4:
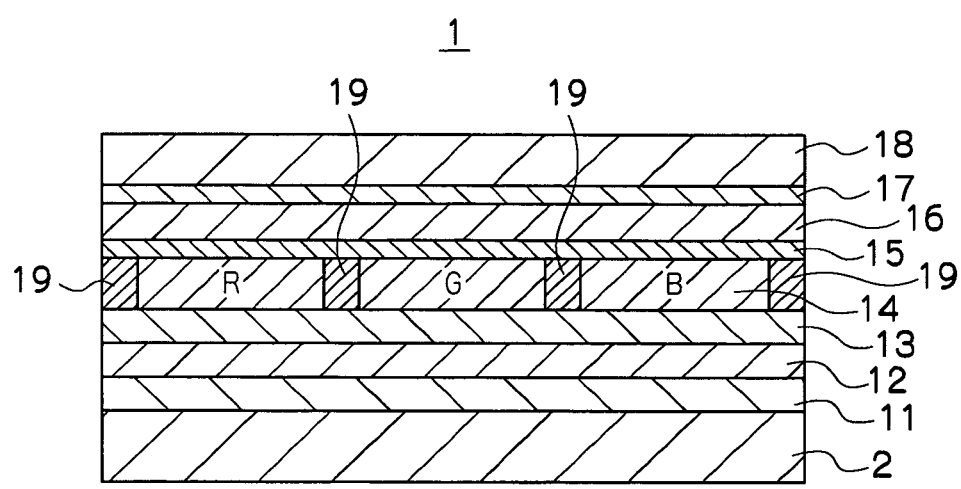
FIG. 4 is a schematic cross-sectional view showing one form of RGB of the organic luminescent layer of this invention.
Figure 5:
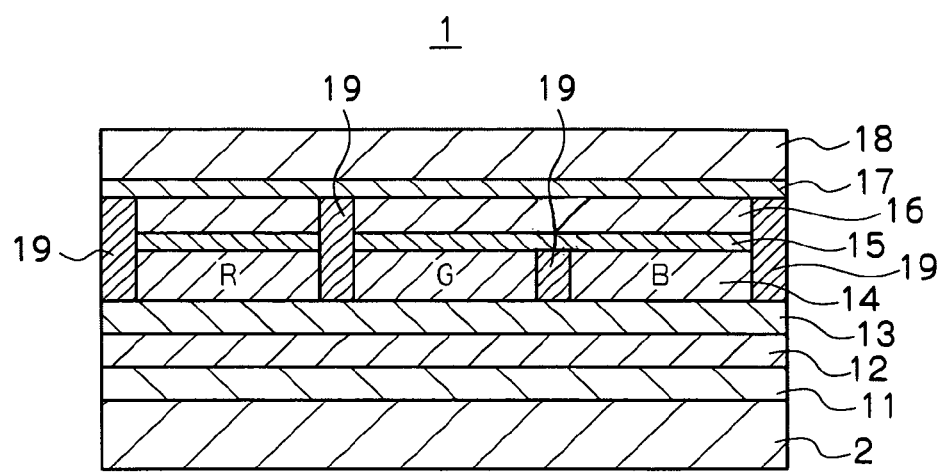
FIG. 5 is a schematic cross-sectional view of another form of RGB of the organic luminescent layer of this invention.

FIGS. 4-7 are schematic cross-sectional diagrams showing embodiment representing a respective one of RGB of the organic EL devices of this invention. Specifically, FIG. 4 shows an embodiment in which respective regions for R (red), G (green), and B (blue) structuring the organic luminescent layer 14 are divided by dividing walls 19. Further, FIG. 4 shows that, after adjusting a carrier balance of the organic luminescent layer in each color, each of the regions for R (red), G (green) and B (blue) is commonly covered by the hole blocking layer 15, the electron transport layer 16 and the like. In addition, FIG. 5 shows that each of regions R (red), G (green) and B (blue) structuring the organic luminescent layer 14 is divided by the dividing walls 19. Further, FIG. 5 shows that, of the three colors, after adjusting the carrier balance of the organic luminescent layer 14 in the colors of G (green) and B (blue), the hole blocking layer 15, the electron transport layer 16 and the like are provided so as to commonly cover the regions of G (green) and B (blue).

The dividing walls 19 are formed by an inorganic material, such as $SiO_2$, or an organic high molecular material, such resist. In the embodiments shown in FIGS. 4-7, the dividing walls 19 are formed on the hole transport layer 13 in advance prior to forming the organic luminescent layer. Thereafter, the organic luminescent layer 14 of each color shown in FIG. 4 is formed by coating with the coating solution for forming the organic luminescent layer while the coating region is divided by the dividing walls 19. The organic luminescent layer 14 of each color shown in FIG. 5, on the other hand, is formed by coating with the coating solution for forming the organic luminescent layer while the coating region is divided by the dividing walls 19. Then, separately in a region for R (red) and a region for G (green) and B (blue), the hole blocking layer 15 and the electron transport layer 16 may be formed by coating or vapor deposition while dividing the coating region by the dividing walls 19. Such embodiments are preferably used for a display with small pixels, such as a high-resolution display.

Figure 6:
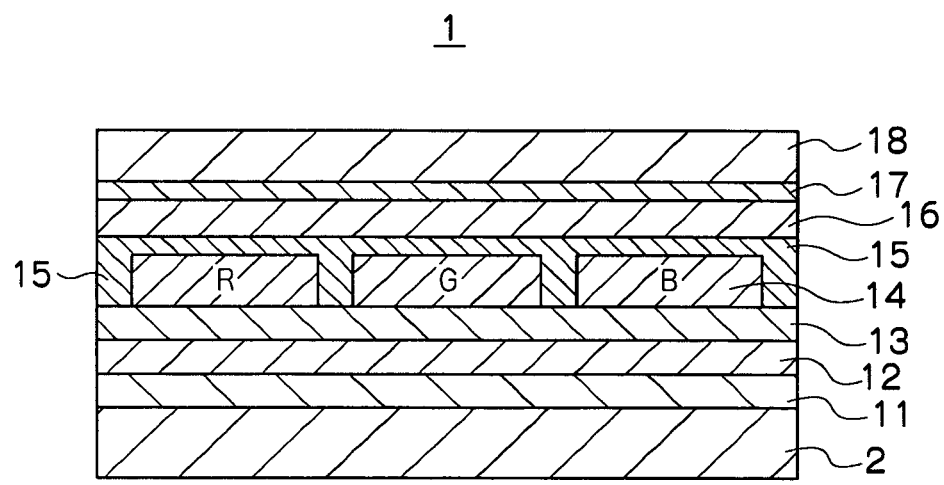
FIG. 6 is a schematic cross-sectional view of yet another form of RGB of the organic luminescent layer of this invention.

In contrast, FIG. 6 shows an embodiment in which each of the regions R (red), G (green) and B (blue) structuring the organic luminescent layer 14 is formed without the dividing walls 19. In the embodiment, similar to FIG. 4, the hole blocking layer 15, the electron transport layer 16 and the like are provided such that each of the regions R (red), G (green) and B (blue) is commonly covered after adjusting the carrier balance of the organic luminescent layer 14 in each color. Such an embodiment may be preferably used in illumination display panels that have area colors having a relatively large region for each color. In addition, there is a merit that in-plane uniformity of the film thickness of the organic luminescent layer in a large area form, which have been difficult under the vapor deposition method used in conventional art, can be easily achieved by the coating method, improving the luminescent characteristics. The color regions that structure the organic luminescent layer 14 typically include R (red), G (green) and B (blue). However, other colors may be possible. In the case of the illumination display device as shown in FIG. 6, for example, because the organic luminescent layer may illuminate light in other fixed colors, the organic luminescent layer in white, black and/or other colors may be arbitrarily formed.

Figure 7:
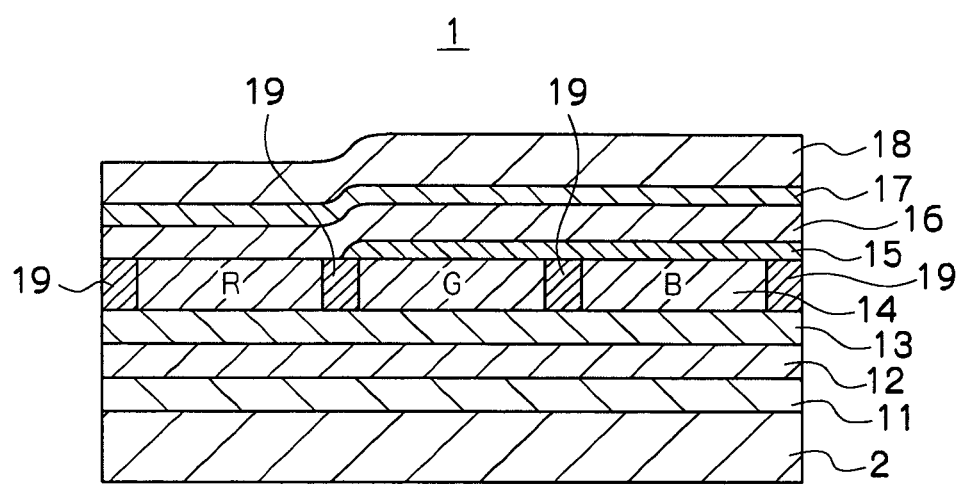
FIG. 7 is a schematic cross-sectional view of yet another form of RGB of the organic luminescent layer of this invention.

Moreover, FIG. 7 shows an embodiment in which the regions of R (red), G (green) and B (blue) that structure the organic luminescent layer 14 are divided by the dividing walls 19 and in which the hole blocking layer 15 is formed by a single material to cover, of the three colors, the regions of G (green) and B (blue) after adjusting the carrier balance of the organic luminescent layer 14 in the colors of G (green) and B (blue). The organic luminescent layer 14 has an device structure in which the hole blocking layer 15 is not provided on the region of R (red) and the electron transport layer 16 is directly provided on the organic luminescent layer 14. Such a formation may be used when a different host material is used for only the region of R from that for the regions of G and B.

The hole blocking layer 15 may be formed by a single material to cover, of the regions of R (red), G (green) and B (blue), the regions of G (green) and B (blue) in FIG. 7, and to cover, of the regions of R (red), G (green) and B (blue), the regions of R (red), G (green) and B (blue) in FIGS. 4 and 6. Whether the hole blocking layer 15 is to be provided commonly on the organic luminescent layer 14 in all colors, whether the hole blocking layer 15 is to be provided on the organic luminescent layer 14 in two colors, or whether hole blocking layers 15 of different low molecular materials are to be provided on the organic luminescent layer in each color, is selected arbitrarily based on the colors of the organic luminescent layer 14. However, from the point of view of the cost for manufacturing or the like, it may be preferable that the hole blocking layer 15 formed by the single material is provided commonly in each color as much as possible.

Figure 8:
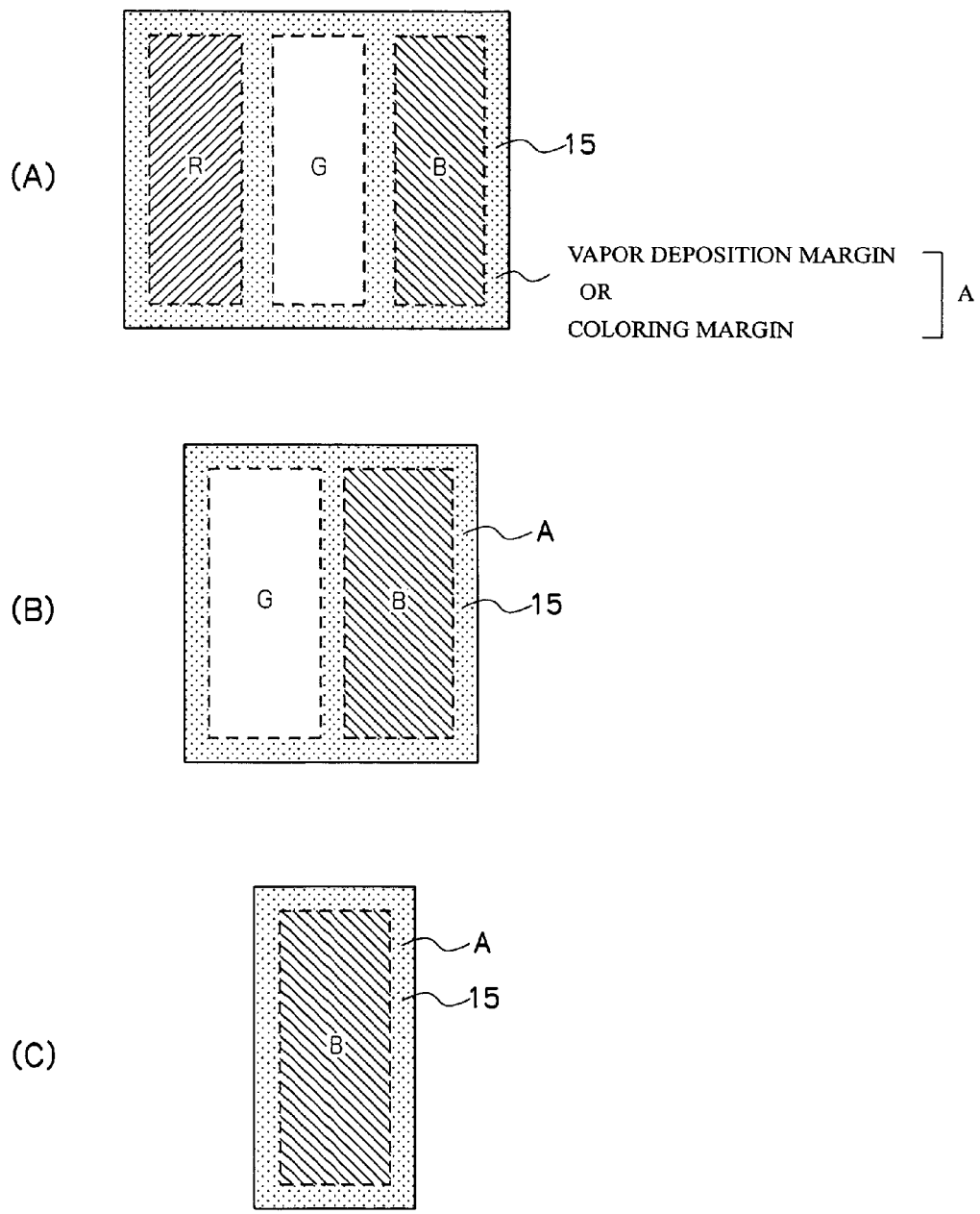
FIGS. 8A, 8B and 8C are plan views showing a form of a hole blocking layer formed on a luminescent layer to cover color regions each color.

FIG. 8 is a schematic plan view showing a formation of the hole blocking layer formed on the organic luminescent layer of each color as viewed in planar view. FIG. 8(A) shows an example in which the hole blocking layer 15 is formed to cover the regions of three colors. FIG. 8(B) shows an example in which the hole blocking layer 15 is formed to cover the regions of two colors. FIG. 8(C) shows an example in which the hole blocking layer 15 covers a region of a single color. In any case, the organic luminescent layer 14 of each color needs to be formed with accuracy in scale within a predetermined section, while the hole blocking layer 15 may be formed in a formation having "a vacuum deposition margin" or "a coating margin" that is wider than the organic luminescent layer 14, and the accuracy in formation needs not be strict. As a result, expensive vacuum deposition devices that have a conventional alignment mechanism and a highly precise and expensive mask for vapor deposition in the predetermined regions are not necessary, and an increase in equipment investment and a reduction of yield can be prevented. Forming the hole blocking layer 15 by coating is extremely advantageous for the cost. Moreover, in such formation, the hole blocking layer 15 is often formed wider than the organic luminescent layer 14 of each color.

[Process for Producing the Organic EL Device]

Next, the process for producing the organic EL device is explained. As discussed above, the process for producing the organic EL device of this invention is a process for producing an organic EL device that has an device structure in which the organic luminescent layer 14 is provided between the anode 11 and the cathode 18. The feature of this invention is that the process for forming the organic luminescent layer 14 is performed by applying a material for forming the organic luminescent layer that includes at least two types of host materials, for which energy values of LUMO (lowest empty orbit) are identical or substantially identical to each other and for which the energy values for HOMO (highest occupied molecular orbital) are different from each other, or for which the energy values of HOMO (highest occupied molecular orbital) are identical or substantially identical to each other and for which the energy values for LUMO (lowest empty orbit) are different each other, and a dopant that is a luminescent compound.

Detailed formation of the organic luminescent layer 14 is as described in the above section for explaining the device structure of the organic EL device. The organic luminescent layer 14 is formed by the coating method, which can support large size panels at low equipment investment. Forming the organic luminescent layer 14 by applying the hole blocking layer 15 and/or the electron transport layer 16 so as to cover two or more color regions of the organic luminescent layer having the regions of R (red), G (green) and B (blue), is preferable in terms of productivity of The organic electroluminescent device. This invention allows providing a process for producing the organic EL device with an easy production process at lower cost compared to the conventional process. In the organic EL device produced by such a process, the host materials that structures the organic luminescent layer 14 function as molecules to form a carrier trap or an energy barrier in the organic luminescent layer and to enhance the current efficiency for luminescence by optimizing the carrier balance between the number of electrons and the number of holes that recombine in the organic luminescent layer 14. As a result, the organic EL device produced by this process can achieve the above-discussed effects.

EXAMPLES

This invention was explained further in detail below with reference to various examples and comparative examples.

However, this invention was not limited to the below examples. A method for evaluating the below examples are discussed below.

(1) Measuring HOMO: Values of a work function measured using a photoelectron spectrometer AC-1 (manufactured by Riken Keiki Co., Ltd.) were used as the values for the highest occupied molecular orbital (HOMO) in this invention. By forming a single layer of material to be measured on a cleaned glass substrate with ITO (manufactured by Sanyo Vacuum Co., Ltd.), energy values at which light electrons were emitted from the photoelectron spectrometer AC-1 were determined. As a condition for measurement, HOMO was measured with the light amount of 50 nW and measured at every 0.05 eV.

(2) Measuring LUMO: For the values of the lowest empty orbit (LUMO) in this invention, an energy gap Eg was calculated based on an edge value of optical absorption spectrum, and the difference between the energy gap Eg and the HOMO obtained as discussed above was determined to be the values of LUMO. The absorption spectrum was determined by forming a single layer of the material to be measured on a cleaned quartz substrate and measuring a difference in optical absorption between this substrate with the thin film and a reference quartz substrate using UV-3100PC (manufactured by Hitachi, Ltd.).

(3) Measuring a film thickness

Unless otherwise indicated, the thickness of each layer described in this invention was determined by forming a single film of each layer on a cleaned glass substrate with ITO (manufactured by Sanyo Vacuum Co., Ltd.) and measuring the produced step of each layer. A probe magnifying glass (Nanopics 1000 manufactured by SII NanoTechnology Inc.) was used for measuring the thickness.

(4) Current efficiency and power efficiency of the organic EL device: The current efficiency and life characteristics of the organic EL device produced in accordance with the embodiments were evaluated. The current efficiency and the power efficiency were calculated by the current-voltage-luminance (I-V-L) measurement. The I-V-L measurement was performed by grounding the cathode and applying a positive current voltage to the anode to scan at every 100mV (1 sec./div.), and by recording the current and luminance at each voltage applied. The intensity was measured using a luminance meter BM-8 manufactured by Topcon Corporation. Based on the obtained results, the luminescent efficiency (cd/A) was calculated from a luminescent area, the current and the intensity.

(5) Measuring chromaticity: Chromaticity was evaluated using $\Delta E94$ color-difference formula (CIE 1994). The chromaticity was determined by measuring the luminescent spectrum of the organic EL device using a spectral radiometer SR-2 manufactured by Topcon Corporation and calculating the value using the above device.

Example 1

An organic EL device was produced by laminating, in layers, in order of, transparent anode, a hole injection layer, a hole transport layer, an organic luminescent layer, a hole blocking layer, an electron transport layer, an electron injection layer and a cathode on a glass substrate, and finally by sealing the organic EL device. Except the transparent anode and the hole injection layer, formation of all layers was formed in a nitrogen-substituting glove box in which the moisture concentration was maintained at 0.1 ppm or below and the oxygen concentration was maintained at 0.1 ppm or below.

First, as a thin film (thickness: 150 nm), indium tin oxide (ITO) was used as the transparent anode. ITO glass substrate (manufactured by Sanyo Vacuum Co., Ltd.) was pattern-formed in a strip shape. The patterned ITO substrate was ultrasonically cleaned in the order of neutral detergent and super pure water and processed under UV ozone.

Next, poly (3,4-ethylene dioxithiophene)-polystyrene sulfonatate (abbreviated as PEDOT-PSS) thin film (thickness: 20 nm) was formed as the hole injection layer on the cleaned anode. The PEDOT-PSS thin film was produced by applying PEDOT-PSS water solution in atmosphere by a spin-coating method. After producing the PEDOT-PSS thin film, the substrate having the PEDOT-PSS thin film on the anode was dried using a hot plate in atmosphere in order to evaporate the moisture. Next, a thin film (thickness: 20 nm) using poly[(9, 9-di-{5-pentenyl}-fluorenyl-2,7-diyl)-co-(4,4'-(N-(4-sec-butylphenyl))diphenylamine)] (abbreviated as heat hardening TFB: manufactured by American Dye Source, Inc.) was formed as the hole transport layer on the produced hole injection layer. This hole transport layer was produced by applying a solution solved in xylene as the coating solution for forming the hole transport layer in a glove box and by thermal-curing the applied solution using the hot plate.

Then, a thin film (thickness: 40 nm) of a mixture of N,N'-bis-(3-methylphenyl)-N,N'-bis-(phenyl)-benzidine (abbreviated as TPD) and 4,4',4"-tris[2-naphthylphenyl-1-phenylamino]triphenylamine (abbreviated as 2-TNATA), which include 4,4'-bis [4-(di-p-tolylamino)styryl]biphenyl (abbreviated as BPAVBi) as a luminescent dopant, was formed as the organic luminescent layer on the produced hole transport layer. A coating solution for forming the organic luminescent layer was produced by solving TPD, 2-TNATA and BPAVBi in toluene such that the weight ratio of PD, 2-TNATA and BPAVBi becomes 9:1:1 (host materials:dopant=10:1). The organic luminescent layer was formed by coating the solution in a glove box by a spin coating method. After forming the organic luminescent layer, the substrate having the organic luminescent layer on the produced hole transport layer was dried in the glove box using a hot plate in order to evaporate the toluene. The HOMO level of TPD was 5.29 eV, and the LUMO level was 2.16 eV. The HOMO level of 2-TNATA was 5.13 eV, and the LUMO level was 2.15 eV. From these values, $\Delta E_{HOMO}$ was 0.01 eV, and $\Delta E_{LUMO}$ was 0.16 eV. Therefore, $\Delta Eg$ was 0.15 eV.

Next, a thin film (thickness: 10 nm) formed of bis(2-methyl-8-quinolinolato)(p-phenylphenolate)aluminum complex (abbreviated as BAlq) was formed as the hole blocking layer on the produced organic luminescent layer by resistive heating deposition in vacuum (pressure: $1 \times 10^{-4}$ Pa). Then, a thin film (thickness: 20 nm) was formed of tris(8-quinolinolato)aluminum complex (Alq3) was formed as the electron transport layer on the produced hole blocking layer by the resistive heating deposition in vacuum (pressure: $1 \times 10^{-4}$ Pa). An LiF film (thickness: 0.5 nm) and an Al film (thickness: 120 nm) were subsequently formed in order as the electron inhibition layer and the cathode, respectively, on the produced electron transport layer by the resistive heating deposition in vacuum (pressure: $1 \times 10^{-4}$ Pa). Finally, after forming the cathode, the organic EL device was sealed using a non-alkali glass and a UV hardening epoxy adhesive to produce the organic EL device of Example 1.

In this organic EL device, the BPAVBi, which is the luminescent dopant, mainly emits light, and the light emitted was blue. Although luminescent spectrums were seen from the materials other than the BPAVBi based on a result of the luminescent spectrum measurement, the luminous values were less than ⅕ of the peak value of the luminescent spectrum of the BPAVBi, which can be ignored. Therefore, in the below description, when the luminance of the other components were less than ⅕ of the luminescent spectrum of the luminescent dopant, it was expressed as "the luminescent dopant (BPAVBi) mainly emits the light."

Examples 2-6

Except that the organic luminescent layer was produced using a solution in which TPD and 2-TNATA, which structure the organic luminescent layer, were solved such that their weight ratio becomes 8:2-1:9 (host materials:dopant=10:1) as shown in Table 1, the organic EL devices of Examples 2-6 were produced in the same manner as that in Example 1. The contained amount of BPAVBi that structures the organic luminescent layer and its weight ratio to TPD and 2-TNATA remained the same as Example 1. In these organic EL devices, BPAVBi, which is the luminescent dopant, mainly emitted light, and the light emitted was blue.

Comparative Examples 1 and 2

Except that the organic luminescent layer was produced using a solution in which TPD and 2-TNATA, which structure the organic luminescent layer, were solved such that their weight ratio becomes 10:0 and 0:10 (host materials:dopant=10:1), respectively, as shown in Table 1, the organic EL devices of Comparative Examples 1 and 2 were produced in the same manner as that in Example 1. The contained amount of BPAVBi that structures the organic luminescent layer and its weight ratio to TPD and 2-TNATA remained the same as Example 1. In these organic EL devices, BPAVBi, which is the luminescent dopant, mainly emitted light, and the light emitted was blue.

Example 7

Except that a thin film (thickness: 10 nm) of 2,9-dimethyl-4,7-diphenyl-1,10-phenanthroline (abbreviated as BCP) was formed as the hole blocking layer instead of the BALq thin film (thickness: 10 nm) and that the Alq3 thin film, which was the electron transport layer, was formed with a thickness of 15 nm instead of 20 nm, the organic EL device of Example 7 was produced in the same manner as that in Example 1. The BCP thin film, which was the hole blocking layer, was formed by the resistive heating deposition method in vacuum (pressure: $1 \times 10^{-4}$ Pa). In this organic EL device, BPAVBi, which is the luminescent dopant, mainly emitted light, and the light emitted was blue.

Example 8 and Comparative Examples 3 and 4

Except that the organic luminescent layer was produced using a solution in which TPD and 2-TNATA, which structure the organic luminescent layer, were solved such that their weight ratio becomes 2:8, 10:0 and 0:10 (host materials:dopant=10:1), respectively, as shown in Table 2, the organic EL devices of Example 8 and Comparative Examples 3 and 4 were produced in the same manner as that in Example 7. The contained amount of BPAVBi that structures the organic luminescent layer and its weight ratio to TPD and 2-TNATA remained the same as Example 7. In these organic EL devices, BPAVBi, which is the luminescent dopant, mainly emitted light, and the light emitted was blue.

Example 9

Except that a thin film (thickness: 40 nm) of a mixture of 4,4-N,N'-dicarbazole-biphenyl (abbreviated as CBP), 4,4'-bis(9-carbazole)2,2'-dimethyl-biphenyl (abbreviated as CDBP) and iridium(iii)bis(2-phenylpyridinate-N,C2'-acetylacetonate) (abbreviated as Ir(ppy)2acac) were formed as the organic luminescent layer instead of the thin film (thickness: 40 nm) of the mixture of TPD and 2-TNATA and BPAVBi, the organic EL device of Example 9 was produced in the same manner as that in Example 1. The organic luminescent layer was formed by preparing a solution in which CBP, CDBP and Ir(ppy)2acac were solved at a weight ratio of 8:2:1 (host materials:dopant=20:1) in toluene, as the coating solution for forming the organic luminescent layer, and by applying this solution in a glove box by a spin coating method. After forming the organic luminescent layer, the substrate having the produced organic luminescent layer was dried using a hot plate in the glove box in order to evaporate the toluene. The HOMO level of CBP was 5.94 eV, and the LUMO level was 2.56 eV. The HOMO level of CDBP was 5.90 eV, and the LUMO level was 2.39 eV. From these values, $\Delta E_{HOMO}$ was 0.04 eV, and $\Delta E_{LUMO}$ was 0.17 eV. Therefore, $\Delta Eg$ was 0.13 eV.

Examples 10 and 11 and Comparative Examples 5 and 6

Except that the organic luminescent layer was produced using a solution in which CBP and CDBP, which structure the organic luminescent layer, were solved such that their weight ratio becomes 5:5, 2:8, 10:0 and 0:10 (host materials:dopant=20:1), respectively, as shown in Table 3, the organic EL devices of Examples 10 and 11 and Comparative Examples 5 and 6 were produced in the same manner as that in Example 9. The contained amount of Ir(ppy)2acac that structures the organic luminescent layer and its weight ratio to CBP and CDBP remained the same as Example 9. In these organic EL devices, Ir(ppy)2acac, which is the luminescent dopant, mainly emitted light, and the light emitted was green.

Example 12

Except that a thin film (thickness: 10 nm) of 2,9-dimethyl-4,7-diphenyl-1,10-phenanthroline (abbreviated as BCP) was formed as the hole blocking layer instead of the BALq thin film (thickness: 10 nm) and that the Alq3 thin film, which was the electron transport layer, was formed with a thickness of 15 nm instead of 20 nm, the organic EL device of Example 12 was produced in the same manner as that in Example 9. The BCP thin film was formed by the resistive heating deposition method in vacuum (pressure: $1 \times 10^{-4}$ Pa). In this organic EL device, Ir(ppy)2acac, which is the luminescent dopant, mainly emitted light, and the light emitted was green.

Examples 13 and 14 and Comparative Examples 7 and 8

Except that the organic luminescent layer was produced using a solution in which CBP and CDBP, which structure the organic luminescent layer, were solved such that their weight ratio became 5:5, 2:8, 10:0 and 0:10 (host materials:dopant=20:1), respectively, as shown in Table 4, the organic EL devices of Examples 13 and 14 and Comparative Examples 7 and 8 were produced in the same manner as that in Example 12. The contained amount of Ir(ppy)2acac that structures the organic luminescent layer and its weight ratio to CBP and CDBP remained the same as Example 12. In these organic EL devices, Ir(ppy)2acac, which is the luminescent dopant, mainly emitted light, and the light emitted was green.

Example 15

A thin film (thickness: 40 nm) of a mixture formed by host materials consisting of CBP and 3-(4-biphenyl)-4-phenyl-5-tert-bithylphenyl-1,2,4-triazole (abbreviated as TAZ) which contains Ir(ppy)3 as the luminescent dopant, was formed as the organic luminescent layer instead of the thin film (thickness: 40 nm) of a mixture of TPD, 2-TNATA and BPAVBi as in Example 1. In addition, except that the Alq3 thin film (thickness: 30 nm) was formed as the electron transport layer on the organic luminescent layer by the resistive heating deposition method without forming the hole blocking layer based on BAlq, the organic EL device of Example 15 was produced in the same manner as that in Example 1. The above-discussed thin film of the mixture was formed by using a solution in which CBP, TAZ and Ir(ppy)$_3$ were solved at a weight ratio of 8:2:0.5 (host materials:dopant=20:1) in toluene, as the coating solution for forming the organic luminescent layer. In these organic EL devices, Ir(ppy)$_3$, which is the luminescent dopant, mainly emitted light, and the light emitted was green. The HOMO level of CBP was 5.94 eV, and the LUMO level was 2.56 eV. The HOMO level of TAZ was 5.82 eV, and the LUMO level was 2.23 eV. From these values, $\Delta E_{HOMO}$ was 0.12 eV, and $\Delta E_{LUMO}$ was 0.33 eV. Therefore, $\Delta Eg$ was 0.21 eV.

Examples 16 and 17 and Comparative Examples 9 and 10

Except that the organic luminescent layer was produced using a solution in which CBP and TAZ, which structure the organic luminescent layer, were solved such that their weight ratio becomes 5:5, 2:8, 10:0 and 0:10 (host materials: dopant=20:1), respectively, as shown in Table 5, the organic EL devices of Examples 16 and 17 and Comparative Examples 9 and 10 were produced in the same manner as that in Example 15. The contained amount of Ir(ppy)$_3$ that structures the organic luminescent layer and its weight ratio to CBP and TAZ remained the same as Example 15. In these organic EL devices, Ir(ppy)$_3$, which is the luminescent dopant, mainly emitted light, and the light emitted was green.

Example 18

Except that the thin film (thickness: 40 nm) of the mixture was formed as the organic luminescent layer using BPAVBi, which is the luminescent dopant, instead of Ir(piq)$_3$, and Alq and CDBP instead of TPD and 2-TNATA, which were the host materials, the organic EL device of Example 18 was produced in the same manner as that in Example 7. The thin film of the mixture was produced by using a solution, in which Balq, CDBP and Ir(ppy)$_3$ were solved in 1,2-dichloroethane at a weight ratio of 8:2:0.5 (host materials:dopant=20:1), as the coating solution for forming the organic luminescent layer. In these organic EL devices, Ir(ppy)$_3$, which is the luminescent dopant, mainly emitted light, and the light emitted was red. The HOMO level of Balq was 5.78 eV, and the LUMO level was 2.83 eV. The HOMO level of CDBP was 5.90 eV, and the LUMO level was 2.39 eV. From these values, $\Delta E_{HOMO}$ was 0.12 eV, and $\Delta E_{LUMO}$ was 0.44 eV. Therefore, $\Delta Eg$ was 0.32 eV.

Examples 19 and 20, and Comparative Examples 11 and 12

Except that the organic luminescent layer was produced using a solution in which BAlq and CDBP, which structure the organic luminescent layer, were solved so that their weight ratio was set to 5:5, 2:8, 10:0 and 0:10 (host materials: dopant=20:1), respectively, as shown in Table 6, the organic EL device of Examples 19 and 20 and Comparative Examples 11 and 12 were produced in the similar manner as Example 18. The contained amount of Ir(piq)$_3$ and the weight ratio of BAlq and CDBP that structure the organic luminescent layer were the same as in Example 18. In these devices, Ir(piq)$_3$ that is the luminescent dopant mainly emitted the light, and the light emitted was red.

Comparative Example 13

Except that □-NPD was used instead of CDBP that structures the organic luminescent layer, the organic EL device of Comparative Example 13 was produced in the same manner as that in Example 18. In this organic EL device, Ir(piq)$_3$, which is the luminescent dopant, mainly emitted light, and the light emitted was red. The HOMO level of Balq was 5.78 eV, and the LUMO level was 2.83 eV. The HOMO level of □-NPD was 5.42 eV, and the LUMO level was 2.42 eV. From these values, $\Delta E_{HOMO}$ was 0.36 eV, and $\Delta E_{LUMO}$ was 0.41 eV. Therefore, $\Delta Eg$ was 0.05 eV.

Comparative Examples 14-17

Except that the organic luminescent layer was produced using a solution in which BA1q and α-NPD, which structure the organic luminescent layer, were solved such that their weight ratio was set to 5:5, 2:8, 10:0 and 0:10 (host materials: dopant=20:1), respectively, as shown in Table 7, the organic EL device of Comparative Examples 14-17 were produced in the similar manner as Comparative Example 13. The contained amount of Ir(piq)$_3$ and its weight ratio to BAlq and α-NPD that structure the organic luminescent layer were the same as in Comparative Example 13. In these organic EL devices, Ir(piq)$_3$ that is the luminescent dopant mainly emitted the light, and the light emitted was red.

Example 21

Except that the thin film (thickness: 40 nm) of the mixture formed by host materials consisting of TPD and PVK (molecular weight Mw: 28,385), and including rubrene as the luminescent dopant, was formed as the organic luminescent layer instead of the thin film (thickness: 40 nm) of the mixture of TPD, 2-TNATA and BPAVBi as in Example 1, the organic EL device of Example 21 was produced in the same manner as that in Example 1. The thin film of the mixture was formed by using a solution in which CBP, PVK and rubrene were solved at a weight ratio of 9.5:0.5:0,5 (host materials: dopant=20:1) in a mixed solution of toluene and dichloroethane (weight ratio 1:1), as the coating solution for forming the organic luminescent layer. In this organic EL device, rubrene, which is the luminescent dopant, mainly emitted light, and the light emitted was yellow. The HOMO level of TPD was 5.29 eV, and the LUMO level was 2.16 eV. The HOMO level of PVK was 5.68 eV, and the LUMO level was 2.19 eV. From these values, $\Delta E_{HOMO}$ was 0.39 eV, and $\Delta E_{LUMO}$ was 0.03 eV. Therefore, $\Delta Eg$ was 0.36 eV.

Examples 22-24 and Comparative Examples 18 and 19

Except that the organic luminescent layer was produced using a solution in which TPD and PVK, which structure the organic luminescent layer, were solved such that their weight ratios were set to 8:2, 2:8, 0.5:9.5, 10:0 and 0:10 (host materials:dopant=20:1), respectively, as shown in Table 8, the organic EL device of Examples 22-24 and Comparative Examples 18 and 19 were produced in the similar manner as Example 21. The contained amount of rubrene that structure the organic luminescent layer and its weight ratio to TPD and PVK were the same as in Example 21. In these organic EL devices, rubrene that is the luminescent dopant mainly emitted the light, and the light emitted was yellow.

Examples 25-28 and Comparative Example 20

Except that the organic luminescent layer was produced using a solution in which TPD, TNATA and BPAVBi, which structure the organic luminescent layer, were solved such that their weight ratios were set to 9.5:0.5:0.5, 9:1:0.5, 8.5:1.5:0.5, 8:2:0.5 and 10:0:0.5, respectively, as shown in Table 9, the organic EL devices of Examples 25-28 and Comparative Example 20 were produced in the similar manner as Example 1. In these organic EL devices, BPAVBi that is the luminescent dopant mainly emitted the light, and the light emitted was blue.

Examples 29-32 and Comparative Example 21

Except that the organic luminescent layer was produced using a solution in which TPD, TNATA and BPAVBi, which structure the organic luminescent layer, were solved such that their weight ratios were set to 9.5:0.5:2, 9:1:2, 8.5:1.5:2, 8:2:2 and 10:0:2, respectively, as shown in Table 9, the organic EL devices of Examples 29-32 and Comparative Example 21 were produced in the similar manner as Example 1. In these organic EL devices, BPAVBi that is the luminescent dopant mainly emitted the light, and the light emitted was blue.

(Evaluation Results)

TABLE 1

| | TPD:TNATA (Weight Ratio) | Voltage (V) | Current Efficiency (cd/A) | Power Efficiency (lm/W) |
|---|---|---|---|---|
| Comparative Example 1 | 10:1 | 7.1 | 1.9 | 0.8 |
| Example 1 | 9:1 | 9.6 | 2.9 | 0.9 |
| Example 2 | 8:2 | 9.1 | 2.9 | 0.9 |
| Example 3 | 6:4 | 8.6 | 2.4 | 0.9 |
| Example 4 | 4:6 | 8.3 | 1.8 | 0.7 |
| Example 5 | 2:8 | 7.8 | 1.8 | 0.7 |
| Example 6 | 1:9 | 7.6 | 1.6 | 0.7 |
| Comparative Example 2 | 0:10 | 7.6 | 1.4 | 0.6 |

*) When driving at 20 mA/cm$^2$

TABLE 2

| | TPD:TNATA (Weight Ratio) | Voltage (V) | Current Efficiency (cd/A) | Power Efficiency (lm/W) |
|---|---|---|---|---|
| Comparative Example 3 | 10:0 | 4.5 | 1.6 | 1.1 |
| Example 7 | 8:2 | 5.9 | 1.8 | 1.0 |
| Example 8 | 2:8 | 5.7 | 1.2 | 0.7 |
| Comparative Example 4 | 0:10 | 5.6 | 1.2 | 0.7 |

*) When driving at 20 mA/cm$^2$

TABLE 3

| | CBP:CDBP (Weight Ratio) | Voltage (V) | Current Efficiency (cd/A) | Power Efficiency (lm/W) |
|---|---|---|---|---|
| Comparative Example 5 | 10:0 | 6.7 | 3.9 | 1.8 |
| Example 9 | 8:2 | 7.8 | 5.1 | 2.1 |
| Example 10 | 5:5 | 8.5 | 4.8 | 1.8 |
| Example 11 | 2:8 | 9.9 | 8.7 | 2.8 |
| Comparative Example 6 | 0:10 | 8.2 | 3.7 | 1.4 |

*) When driving at 20 mA/cm$^2$

TABLE 4

| | CBP:CDBP (Weight Ratio) | Voltage (V) | Current Efficiency (cd/A) | Power Efficiency (lm/W) |
|---|---|---|---|---|
| Comparative Example 7 | 10:0 | 7.9 | 3.9 | 1.6 |
| Example 12 | 8:2 | 8.5 | 5.8 | 2.1 |
| Example 13 | 5:5 | 8.8 | 3.5 | 1.2 |
| Example 14 | 2:8 | 8.7 | 3.1 | 1.2 |
| Comparative Example 8 | 0:10 | 8.5 | 3.3 | 1.2 |

*) When driving at 20 mA/cm$^2$

From the results of Examples 1-6 and Comparative Examples 1 and 2 shown in Table 1, it is understood that in the organic EL devices having an organic luminescent layer, in which luminescent dopant is added to a thin film of mixture of TPD and TNATA that are structured such that the LUMO energy values are identical to each other ($\Delta E_{LUMO}$=0.01 eV<0.15 eV) and the HOMO energy values are different ($\Delta E_{HOMO}$=0.16 eV>0.15 eV), the driving voltage is increased compared to the organic EL device having an organic luminescent layer formed by TPD as the host material (Comparative Example 1) and the organic EL device having an organic luminescent layer formed by TNATA as the host material (Comparative Example 2). That is, an organic EL device containing two types of host materials has a higher driving voltage than an organic EL device that uses only one of the two types of the host materials having a higher contained amount than the other one of the two types of the host materials. From these results, it is assumed that, by mixing materials for which the HOMO energy values are different from each other as the host materials, each material forms a trap site or creates an energy barrier, causing a decrease in mobility of holes in the organic luminescent layer. By adjusting the mobility of the holes, the recombination efficiency increases. It is observed that, in Example 2, the efficiency increased to 2.8 cd/A.

From results of Examples 7 and 8 and Comparative Examples 3 and 4 as shown in Table 2, the driving voltage increases when TPD and TNATA are mixed, even when the hole inhibition is formed of BCP instead of BAlq. Although the maximum value differs from the case of BAlq, the efficiency increased to 1.8 cd/A in Example 7.

From the results of Examples 9-11 and Comparative Examples 5 and 6 shown in Table 3, it is understood that in the organic EL devices having an organic luminescent layer, in which luminescent dopant is added to a combined thin film of CBP and CDBP that are structured such that the HOMO energy values are identical to each other ($\Delta E_{HOMO}$=0.04 eV<0.15 eV) and the LUMO energy values are different ($\Delta E_{LUMO}$=0.17 eV>0.15 eV), the driving voltage is increased compared to the organic EL device having an organic luminescent layer formed by CBP as the host material (Comparative Example 5) and the organic EL device having an organic luminescent layer formed by CDBP as the host material (Comparative Example 6). From these results, it is assumed that, by mixing materials, for which the LUMO energy values are different from each other, as the host materials, each material forms a trap site or creates an energy barrier, causing a decrease in mobility of electrons in the organic luminescent layer. By adjusting the mobility of the electrons, the recombination efficiency increases. It is observed that, in Example 11, the efficiency increased to 8.7 cd/A.

From the results of Examples 12-14 and Comparative Examples 7 and 8 as shown in Table 4, the driving voltage increases if a thin film of the mixture of CBP and CDBP is mixed, even when the hole inhibition is formed of BCP instead of BAlq. Although the maximum value differs from the case of BAlq, the efficiency increased to 5.8 cd/A in Example 12.

TABLE 5

| | CBP:TAZ (Weight Ratio) | Voltage (V) | Current Efficiency (cd/A) | Power Efficiency (lm/W) |
|---|---|---|---|---|
| Comparative Example 9 | 10:0 | 6.7 | 1 | 0.5 |
| Example 15 | 8:2 | 7.1 | 12 | 5.3 |
| Example 16 | 5:5 | 6.6 | 9 | 4.3 |
| Example 17 | 2:8 | 6.5 | 8 | 3.9 |
| Comparative Example 10 | 0:10 | 5.2 | 0.6 | 0.4 |

*) When driving at 20 mA/cm$^2$

TABLE 6

| | BAlq:CDBP (Weight Ratio) | Voltage (V) | Current Efficiency (cd/A) | Power Efficiency (lm/W) |
|---|---|---|---|---|
| Comparative Example 11 | 10:0 | 12 | 2.4 | 0.6 |
| Example 18 | 8:2 | 13 | 3.3 | 0.8 |
| Example 19 | 5:5 | 10 | 1.8 | 0.6 |
| Example 20 | 2:8 | 10 | 1.3 | 0.4 |
| Comparative Example 12 | 0:10 | 9 | 1.2 | 0.4 |

*) When driving at 20 mA/cm$^2$

TABLE 7

| | BAlq:NPD (Weight Ratio) | Voltage (V) | Current Efficiency (cd/A) | Power Efficiency (lm/W) |
|---|---|---|---|---|
| Comparative Example 13 | 10:0 | 12 | 2.4 | 0.6 |
| Comparative Example 14 | 8:2 | 14.5 | 2.1 | 0.5 |
| Comparative Example 15 | 5:5 | 17 | 2.0 | 0.4 |
| Comparative Example 16 | 2:8 | 11 | 2.4 | 0.7 |
| Comparative Example 17 | 0:10 | 8.8 | 3.2 | 1.1 |

*) When driving at 20 mA/cm$^2$

TABLE 8

| | BAlq:CDBP (Weight Ratio) | Voltage (V) | Current Efficiency (cd/A) | Power Efficiency (lm/W) |
|---|---|---|---|---|
| Comparative Example 13 | 10:0 | 5.5 | 2.0 | 1.1 |
| Example 21 | 9.5:0.5 | 5.9 | 2.4 | 1.3 |
| Example 22 | 8:2 | 6.4 | 3.3 | 1.6 |
| Example 23 | 2.8 | 7.0 | 1.5 | 0.7 |
| Example 24 | 0.5:9.5 | 6.0 | 1.5 | 0.8 |
| Comparative Example 19 | 0:10 | 5.9 | 1.2 | 0.6 |

*) When driving at 20 mA/cm$^2$

TABLE 9

| | Dopant Ratio | BAlq:NPD (Weight Ratio) | Voltage (V) | Current Efficiency (cd/A) | Power Efficiency (lm/W) |
|---|---|---|---|---|---|
| Comparative Example 20 | 0.5 | 10:0 | 6.9 | 2.0 | 0.9 |
| Example 25 | 0.5 | 9.5:0.5 | 8.5 | 3.1 | 1.1 |
| Example 26 | 0.5 | 9:1 | 8.3 | 3.1 | 1.2 |
| Example 27 | 0.5 | 8.5:1.5 | 8.0 | 2.8 | 1.1 |
| Example 28 | 0.5 | 8:2 | 7.8 | 2.7 | 1.1 |
| Comparative Example 1 | 1 | 10:0 | 7.1 | 1.9 | 0.8 |
| Example 1 | 1 | 9:1 | 9.6 | 2.9 | 0.9 |
| Example 2 | 1 | 8:2 | 9.1 | 2.8 | 1.0 |
| Comparative Example 21 | 2 | 10:2 | 7.3 | 1.6 | 0.7 |
| Example 29 | 2 | 9.5:0.5 | 8.3 | 1.7 | 0.6 |
| Example 30 | 2 | 9:1 | 10.1 | 1.9 | 0.6 |
| Example 31 | 2 | 8.5:1.5 | 10 | 2.0 | 0.6 |
| Example 32 | 2 | 8:2 | 9.8 | 1.8 | 1.6 |

*) When driving at 20 mA/cm$^2$

From the results of Examples 15-17 and Comparative Examples 9 and 10 shown in Table 5, it is understood that in the organic EL devices having an organic luminescent layer, in which luminescent dopant is added to a thin film of the mixture of CBP and TAZ that are structured such that the HOMO energy values are identical to each other ($\Delta E_{HOMO}$=0.12 eV<0.15 eV) and the LUMO energy values are different ($\Delta E_{LUMO}$=0.33 eV>0.15 eV), the driving voltage is increased compared to the organic EL device having an organic luminescent layer formed by CBP as the host material (Comparative Example 9) and the organic EL device having an organic luminescent layer formed by TAZ as the host material (Comparative Example 10). From these results, it is assumed that, by mixing materials, for which the LUMO energy values are different from each other, as the host materials, each material forms a trap site or creates an energy barrier, causing decrease in mobility of electrons in the organic luminescent layer. By adjusting the mobility of the electrons, the recombination efficiency increases. It is observed that in Example 15, the efficiency increased to 12 cd/A.

From the results of Examples 18-20 and Comparative Examples 11 and 12 shown in Table 5, it is understood that in the organic EL devices having an organic luminescent layer, in which luminescent dopant is added to a thin film of the mixture of BAlq and CDBP that are structured such that the HOMO energy values are identical to each other ($\Delta E_{HOMO}$=0.12 eV<0.15 eV) and the LUMO energy values are different ($\Delta E_{LUMO}$=0.44 eV>0.15 eV), the driving voltage is increased compared to the organic EL device having an organic luminescent layer formed by BAlq as the host material (Comparative Example 11) and the organic EL device having an organic luminescent layer formed by CDBP as the host material (Comparative Example 12). From these results, it is assumed that, by mixing materials for which the LUMO energy values are different from each other as the host materials, each material forms a trap site or creates an energy barrier, causing a decrease in mobility of electrons in the organic luminescent layer. By adjusting the mobility of the electrons, the recombination efficiency increases. It is observed that in Example 18, the efficiency increased to 3.3 cd/A.

From the results of Examples 13-17 shown in Table 7, it is understood that in the organic EL devices having an organic luminescent layer, in which luminescent dopant is added to a combined thin film of BAlq and NPD that are structured such that the HOMO energy values are different ($\Delta E_{HOMO}$=0.36 eV<0.15 eV) and the LUMO energy values are also different ($\Delta E_{LUMO}$=0.41 eV>0.15 eV) (Comparative Examples 14-16), the driving voltage is increased, but the current efficiency is decreased, compared to the organic EL device having an organic luminescent layer in which luminescent dopant is added to a thin film of mixture that is structured such that the HOMO energy values are identical to each other and the LUMO energy values are different (e.g., Example 18), the organic EL device having an organic luminescent layer formed by BAlq as the host material (Comparative Example 13) and the organic EL device having an organic luminescent layer formed by CDBP as the host material (Comparative Example 17). From these results, it is assumed that, by mixing materials for which both the HOMO and LUMO energy values are different from each other as the host materials, adjustment of the carrier mobility in both host material] are not performed well. Moreover, it is understood that the efficiency of recombination with the luminescent dopant decreases due to formation of excimer by mutual reaction of LUMO of NPD and HOMO of BAlq, resulting the production efficiency to be decreased.

From the results of Examples 21-24 and Comparative Examples 18 and 19 shown in Table 8, it is understood that in the organic EL devices having an organic luminescent layer, in which luminescent dopant is added to a combined thin film of TPD and PVK that are structured such that the HOMO energy values are different from each other ($\Delta E_{HOMO}$=0.39 eV>0.15 eV) and the LUMO energy values are identical to each other ($\Delta E_{LUMO}$=0.03 eV>0.15 eV), the driving voltage is increased compared to the organic EL device having an organic luminescent layer formed by TPD as the host material (Comparative Example 18) and the organic EL device having an organic luminescent layer formed by PVK as the host material (Comparative Example 19). From these results, it is assumed that, by mixing materials, for which the HOMO energy values are different from each other, as the host materials, each material forms a trap site or creates an energy barrier, causing decrease in mobility of electrons in the organic luminescent layer. In the organic luminescent layer described Patent Document 2, a small mixture of PVK and TPD (same as the ratio used in Example 24 of this application) are described as an example. In this application, the high efficiency is possible under a condition of Example 22 in which TPD and PVK are contained.

From the results of Examples 1, 2 and 25-32 and Comparative Examples 1, 20 and 21 as shown in FIG. 9, the organic EL devices with a smaller percentage of the luminescent dopant compared to the weight ratio of TNATA, which is the host material with the less composition ratio, become highly efficient. Actually, the carrier balance changes due to the concentration of the dopant, because the luminescent dopant also becomes a trap site. However, when the dopant concentration increases, the luminescent efficiency decreases due to concentration quenching in general. According to the method of this application, the carrier trap concentration can be controlled while the concentration of the luminescent dopant is maintained at the optimum level. Based on the results in Table 9, when the dopant ratio is 0.5 and the weight ratio of TNATA is 1, the power efficiency is high because of 1.21 m/W (Example 26). When the dopant ratio is 1 and the ratio of TNATA is 2, the power efficiency is high because of 1.01 m/W (Example 2). From these results, it is understood that the mixture percentage of TNATA, which is one of the mixed host materials with less amount of mixture, is preferably two or more times of the concentration of the luminescent dopant.

Based on the above results, when producing a panel by forming the organic luminescent layer colored with various colors and by applying the same hole blocking layer, electron transport layer, electron injection layer and cathode for all colors (see, for example, FIGS. 4 and 6), a mixture ratio of two or more types of host materials that structure the organic luminescent layer should be selected by adjusting the optimum value of the balance of mobility between the electrons and holes in order to suppress the electricity consumed by the panel.

For example, when forming a structure of a cathode layer using BAlq in the hole blocking layer commonly on the organic luminescent layer that illuminates in blue using BDAVBi as the luminescent dopant and on the organic luminescent layer that illuminates in green with Ir(ppy)2acac as the luminescent dopant (Examples 1-6, Comparative Examples 1 and 2, Examples 9-11 and Comparative Examples 5 and 6; see FIGS. 5 and 7), it is understood that the organic luminescent layer is preferably formed by combining 1.01 m/W in Example 2 and 2.81 m/W in Example 11. This can be understood that the power efficiency of the panel improves compared with 0.81 m/W (Comparative Example 1) and 1.81 m/W (Comparative Example 5) in which only TPD is used as the host material.

Similarly, when forming a structure of a cathode layer using BCP in the hole blocking layer commonly on the organic luminescent layer that illuminates in blue using BDAVBi as the luminescent dopant and on the organic luminescent layer that illuminates in green with Ir(ppy)2acac as the luminescent dopant (Examples 7 and 8, Comparative Examples 3 and 4, Examples 12-14 and Comparative Examples 7 and 8; see FIGS. 5 and 7), it is understood that the organic luminescent layer is preferably formed by combining 1.11 m/W in Example 3 and 2.11 m/W in Example 12. This can be understood that the power efficiency of the panel improves compared with 1.11 m/W (Comparative Example 3) and 1.61 m/W (Comparative Example 7) in which only CBP is used as the host material.

Yet similarly, when forming a structure of a cathode layer using BCP in the hole blocking layer commonly on the organic luminescent layer that illuminates in blue using BDAVBi as the luminescent dopant, on the organic luminescent layer that illuminates in green with Ir(ppy)2acac as the luminescent dopant, and on the organic luminescent layer that illuminates in red with Ir(piq)3 as the luminescent dopant, it is understood that the organic luminescent layer is preferably formed by combining 1.11 m/W in Comparative Example 3, 2.11 m/W in Example 12 and 0.81 m/W in Example 18. This can be understood that the power efficiency of the panel improves compared with a case of a single host material.

The invention claimed is:

1. An organic electroluminescent element, comprising:
an anode;
a cathode;

an organic luminescent layer that is positioned between the anode and cathode and that includes at least two types of host materials and a dopant, the organic luminescent layer including regions that respectively illuminate lights in red (R), green (G), and blue (B); and at least one of a hole inhibition layer and an electron transport layer that is provided in order between the organic luminescent layer and the cathode, and that contiguously covers two or more regions among a R region, a G region, and a B region of the organic luminescent layer, wherein energy values of LUMO (Lowest Unoccupied Molecular Orbital) for the host materials are identical or substantially identical to each other, energy values of HOMO (Highest Occupied Molecular Orbital) for the host materials are different, the dopant is a luminescent compound, and at least one of the hole inhibition layer and the electron transport layer that contiguously covers the two or more regions is formed by at least one of the same impurity type and the same layer thickness of a structuring material in the two or more regions, wherein the at least one of a hole inhibition layer and an electron transport layer that is provided in order between the organic luminescent layer and the cathode, contiguously covers only two regions among a R region, a G region, and a B region of the organic luminescent layer.

2. The organic electroluminescent element of claim 1, wherein the host materials and the dopant are low molecular compounds.

3. The organic electroluminescent element of claim 1, wherein one of the at least two host materials with a lower contained amount is included at a contained amount that is two or more times a contained amount of the dopant.

4. The organic electroluminescent element of claim 1, wherein a driving voltage of the element that includes the at least two host materials is made higher compared to an organic electroluminescent element that includes only one of the at least two host materials, the one of the at least two host materials being one of the at least two host materials that is larger in an amount contained in the element than the other of the at least two host materials.

5. The organic electroluminescent element of claim 1, wherein the at least one of the hole inhibition layer and the electron transport layer that contiguously covers the two or more regions is formed by the same impurity type and the same layer thickness of a structuring material in the two or more regions.

6. An organic electroluminescent element, comprising:
an anode;
a cathode;
an organic luminescent layer that is positioned between the anode and cathode that includes at least two types of host materials and a dopant, the organic luminescent layer including regions that respectively illuminate lights in red (R), green (G), and blue (B); and at least one of a hole inhibition layer and an electron transport layer that is provided between the organic luminescent layer and the cathode, and that contiguously covers two or more regions among a R region, a G region, and a B region of the organic luminescent layer, wherein energy values of HOMO (Highest Occupied Molecular Orbital) for the host materials are identical or substantially identical to each other, energy values of LUMO (Lowest Unoccupied Molecular Orbital) for the host materials are different, the dopant is a luminescent compound, and at least one of the hole inhibition layer and the electron transport layer that contiguously covers the two or more regions is formed by at least one of the same impurity type and the same layer thickness of a structuring material in the two or more regions, wherein the at least one of a hole inhibition layer and an electron transport layer that is provided in order between the organic luminescent layer and the cathode, contiguously covers only two regions among a R region, a G region, and a B region of the organic luminescent layer.

7. The organic electroluminescent element of claim 6, wherein the host materials and the dopant are low molecular compounds.

8. The organic electroluminescent element of claim 6, wherein one of the at least two host materials with a lower contained amount is included at a contained amount that is two or more times a contained amount of the dopant.

9. The organic electroluminescent element of claim 6, wherein a driving voltage of the element that includes the at least two host materials is made higher compared to an organic electroluminescent element that includes only one of the at least two host materials, the one of the at least two host materials being one of the at least two host materials that is larger in an amount contained in the element than the other of the at least two host materials.

10. The organic electroluminescent element of claim 6, wherein the at least one of the hole inhibition layer and the electron transport layer that contiguously covers the two or more regions is formed by the same impurity type and the same layer thickness of a structuring material in the two or more regions.

11. A method of producing an organic electroluminescent element having an element structure in which an organic luminescent layer is provided between an anode and a cathode, comprising:

forming the organic luminescent layer by applying an organic luminescent layer forming material that includes a dopant and at least two types of host materials, the host materials each having energy values of LUMO (Lowest Unoccupied Molecular Orbital) and energy values of HOMO (Highest Occupied Molecular Orbital), the organic luminescent layer including regions that respectively illuminate lights in red (R), green (G), and blue (B); and at least one of a hole inhibition layer and an electron transport layer that is provided between the organic luminescent layer and the cathode, and that contiguously covers two or more regions among a R region, a G region, and a B region of the organic luminescent layer, wherein the LUMO energy values are identical or substantially identical to each other and the HOMO energy values are different, the dopant is a luminescent compound, and at least one of the hole inhibition layer and the electron transport layer that contiguously covers the two or more regions is formed by at least one of the same impurity type and the same layer thickness of a structuring material in the two or more regions, wherein the at least one of a hole inhibition layer and an electron transport layer that is provided in order between the organic luminescent layer and the cathode, contiguously covers only two regions among a R region, a G region, and a B region of the organic luminescent layer.

12. The method of producing an organic electroluminescent element of claim 11, wherein the at least one of the hole inhibition layer and the electron transport layer that contiguously covers the two or more regions is formed by the same impurity type and the same layer thickness of a structuring material in the two or more regions.

13. A method of producing an organic electroluminescent element having a device structure in which an organic luminescent layer is provided between an anode and a cathode, comprising:

forming the organic luminescent layer by applying an organic luminescent layer forming material that includes a dopant and at least two types of host materials, the host materials each having energy values of LUMO (Lowest Unoccupied Molecular Orbital) and energy values of HOMO (Highest Occupied Molecular Orbital), the organic luminescent layer including regions that respectively illuminate lights in red (R), green (G), and blue (B); and at least one of a hole inhibition layer and an electron transport layer that is provided between the organic luminescent layer and the cathode, and that contiguously covers two or more regions among a R region, a G region, and a B region of the organic luminescent layer, wherein the dopant is a luminescent compound, the HOMO energy values are identical or substantially identical to each other and the LUMO energy values are different, and at least one of the hole inhibition layer and the electron transport layer that contiguously covers the two or more regions is formed by at least one of the same impurity type and the same layer thickness of a structuring material in the two or more regions, wherein the at least one of a hole inhibition layer and an electron transport layer that is provided in order between the organic luminescent layer and the cathode, contiguously covers only two regions among a R region, a G region, and a B region of the organic luminescent layer.

14. The method of producing an organic electroluminescent element of claim 13, wherein the at least one of the hole inhibition layer and the electron transport layer that contiguously covers the two or more regions is formed by the same impurity type and the same layer thickness of a structuring material in the two or more regions.

* * * * *